US007173454B2

(12) United States Patent
Kobayashi et al.

(10) Patent No.: US 7,173,454 B2
(45) Date of Patent: Feb. 6, 2007

(54) DISPLAY DEVICE DRIVER CIRCUIT

(75) Inventors: Hideto Kobayashi, Tokyo (JP); Gen Tada, Tokyo (JP); Yoshihiro Shigeta, Tokyo (JP); Hiroshi Shimabukuro, Tokyo (JP)

(73) Assignee: Fuji Electric Device Technology Co., Ltd, Tokyo (JP)

( * ) Notice: Subject to any disclaimer, the term of this patent is extended or adjusted under 35 U.S.C. 154(b) by 158 days.

(21) Appl. No.: 11/062,780

(22) Filed: Feb. 23, 2005

(65) Prior Publication Data

US 2005/0195179 A1 Sep. 8, 2005

(30) Foreign Application Priority Data

Mar. 4, 2004 (JP) .............................. 2004-061176
Aug. 27, 2004 (JP) .............................. 2004-248476

(51) Int. Cl.
*H03K 19/0175* (2006.01)

(52) U.S. Cl. ............................ 326/83; 326/68; 326/93

(58) Field of Classification Search .................. 326/63, 326/68, 83, 86, 93

See application file for complete search history.

(56) References Cited

U.S. PATENT DOCUMENTS

| | | | | |
|---|---|---|---|---|
| 5,786,711 | A * | 7/1998 | Choi | 326/83 |
| 6,501,306 | B1 * | 12/2002 | Kim et al. | 327/112 |
| 6,965,255 | B2 * | 11/2005 | Gans | 327/51 |
| 2003/0214477 | A1 * | 11/2003 | Murakami et al. | 345/100 |
| 2004/0212561 | A1 * | 10/2004 | Matsuda et al. | 345/60 |

FOREIGN PATENT DOCUMENTS

| | | |
|---|---|---|
| JP | 11-098000 | 4/1999 |
| JP | 2000-164730 | 6/2000 |
| JP | 2001-134230 | 5/2001 |
| JP | 2002-341785 | 11/2002 |

* cited by examiner

*Primary Examiner*—Don Le
(74) *Attorney, Agent, or Firm*—Rabin & Berdo, P.C.

(57) ABSTRACT

A display device driver circuit includes a timer circuit 20 that outputs to output stage circuits 10 a control signal for turning off IGBTs 11 and 12 when a next clock signal is not inputted to the timer circuit 20 for a predetermined period of time, and the output stage circuits 10 turn off the IGBTs 11 and 12 to put the output terminals $D_O$ thereof into a high impedance state so that an overcurrent may be prevented from flowing through the IGBTs 11 and 12.

20 Claims, 22 Drawing Sheets

DISPLAY DEVICE DRIVER CIRCUIT

CROSS-REFERENCE TO RELATED APPLICATIONS

This application claims the benefit of priority under 35 USC 119 of Japanese patent application number 2004-061176, filed Mar. 4, 2004, and Japanese patent application number 2004-248476, filed Aug. 27, 2004 the entire disclosures of which are incorporated herein by reference.

FIELD OF THE INVENTION

The present invention relates to driver circuits for driving flat panel display devices. Specifically, the present invention relates to a driver circuit for driving plasma display panels.

BACKGROUND OF THE INVENTION

Recently, wall television sets using a thin plasma display panel (hereinafter referred to as a "PDP") having a wide screen have been attracting much attention. FIG. 25 is a block diagram schematically showing the structure of a PDP driver for driving a PDP.

For the sake of simplicity, an exemplary PDP 700 having two electrodes is illustrated in FIG. 25. The PDP 700 includes a plurality of scan driver ICs (integrated circuits) 800-1, 800-2, 800-3, . . . , and 800-k, and also data (address) driver ICs 900-1, 900-2, 900-3, . . . , and 900-m. (Here k and m are arbitrary numbers.)

The scan driver ICs 800-1, 800-2, 800-3, . . . , and 800-k drive respective multiple scanning and holding electrodes 911. The data (address) driver ICs 900-1, 900-2, 900-3, . . . , and 900-m drive respective multiple data electrodes 912 corresponding to the respective colors R (red), G (green), and B (blue). The scanning and holding electrodes 911 and the data electrodes 912 are extended perpendicularly to each other such that a lattice is formed and discharge cells (not shown) are arranged at the cross points of the electrodes 911 and 912.

If each scan driver IC 800-1, 800-2, 800-3, . . . , or 800-k is capable of driving 64 scanning and holding electrodes 911, the number k will be 12 for the extended video graphic array (XGA), since the PDP 700 has 1024×768 pixels.

For displaying images, data is written to the discharge cells from data electrodes 912 by scan driver ICs 800-1 through 800-k and data driver ICs 900-1 through 900-m and by scanning the scanning and holding electrodes 911 (address discharge period) and the discharge in the discharge cells is maintained by outputting holding pulses several times to the scanning and holding electrodes 911 (discharge holding period).

Now the structure of the conventional scan driver IC (hereinafter referred to as the "display device driver circuit" or simply as the "display driver") will be described below. FIG. 26 is a block diagram of a conventional display device driver circuit.

Referring now to FIG. 26, the conventional display driver 800 includes shift registers 810-1 through 810-n, data selectors 820-1 through 820-n, and output stage circuits 830-1 through 830-n. The shift registers 810-1, 810-2, 810-3, . . . , and 810-n convert the serial signals inputted via a terminal DATA for controlling the scanning and holding electrodes 911 to parallel signals in synchronism with a clock signal inputted to a terminal CLK. The data selectors 820-1, 820-2, 820-3, . . . , and 820-n send the signals transferred bit by bit from the shift registers 810-1, 810-2, 810-3, . . . , and 810-n to the output stage circuits 830-1, 830-2, 830-3, . . . , and 830-n. Here, n is an arbitrary number, which, for example, is 64 for the 64 bits display driver 800. The display driver 800 drives 64 scanning and holding electrodes 911. A terminal SH and a terminal SL are connected to the data selectors 820-1, 820-2, 820-3, . . . , and 820-n. An all-the-outputs H-level-fixing signal for fixing all the scanning and holding electrodes 911 at an H (high) level is inputted to the terminal SH. An all-the-outputs L-level-fixing signal for fixing all the scanning and holding electrodes 911 at an L (low) level is inputted to the terminal SL.

FIG. 27 is a block circuit diagram of the conventional output stage circuit in the display driver for driving the PDP. Referring now to FIG. 27, the output stage circuit 830 includes a level shifter circuit 831, inverters 832 and 833, a buffer circuit 834, and two insulated gate bipolar transistors (IGBTs) 835 and 836 capable of making a high current flow across a unit area.

The level shifter circuit 831 is formed of p-channel MOSFETs (p-channel metal oxide semiconductor field effect transistors: hereinafter referred to as "PMOSs") 831*a* and 831*b* exhibiting a high breakdown voltage; and n-channel MOSFETs (hereinafter referred to as "NMOSs") 831*c* and 831*d*. The source terminal of the PMOS 831*a* is connected to a high voltage supply terminal VDH that feeds a voltage between 0 V and a VDH level (100 V). The drain terminal of the PMOS 831*a* is connected to the drain terminal of the NMOS 831*c*, the gate terminal of the PMOS 831*b*, and the gate terminal of the IGBT 836. The gate terminal of the PMOS 831*a* is connected to the drain terminal of the PMOS 831*b* and the drain terminal of the NMOS 831*d*. The source terminal of the PMOS 831*b* is connected to a high voltage supply terminal VDH. The drain terminal of the PMOS 831*b* is connected to the drain terminal of the NMOS 831*d* and the gate terminal of the PMOS 831*a*. The gate terminal of the PMOS 831*b* is connected to the drain terminal of the PMOS 831*a*. The source terminals of the NMOSs 831*c* and 831*d* are grounded. The signal inputted from an input terminal IN (the signal outputted from any of the data selectors 820-1 through 820-n) is inputted to the gate terminal of the NMOS 831*c* via the inverter 832, and is inputted to the gate terminal of the NMOS 831*d* via the inverters 832 and 833.

The buffer circuit 834 inverts the level of the signal inputted from the input terminal IN via the inverters 832 and 833, and inputs the signal with the level thereof inverted to the gate terminal of the IGBT 835. The collector terminal of the IGBT 836 is connected to the high voltage supply terminal VDH. The emitter terminal of the IGBT 836 is connected to an output terminal $D_O$ and the collector terminal of the IGBT 835. The emitter terminal of the IGBT 835 is grounded.

The output terminal $D_O$ is connected to the scanning and holding electrodes 911 shown in FIG. 25 and further to the discharge cells (regarded as capacitance). The operations of the output stage circuit 830 are described below with reference to a timing chart.

In the following, the voltage of 100 V will be sometimes referred to as the "VDH level" and the voltage of 5 V as the "VDL level". FIG. 28 is a timing chart illustrating the operations of the conventional output stage circuit.

In FIG. 25, the voltage waveforms of the input signal inputted to the input terminal IN, the gate signals of the NMOSs 831*c* and 831*d*, and the gate signals of the IGBTs 835 and 836 are shown. Also shown are the voltage waveforms of the output signal from the output terminal $D_O$.

As an input signal of 5 V (the VDL level) is inputted to the input terminal IN (at the time t10), setting the input terminal IN at the H level, the gate signal of the NMOS 831*c* is set at the L level, turning off the NMOS 831*c*. The gate signal of the NMOS 831*d* is set at the H level, turning on the NMOS 831*d*. As a result, the PMOS 831*a* is turned on, setting the gate signal of the IGBT 836 at 100 V. The IGBT 836, with the gate signal thereof set at 100 V, is turned on, outputting the output voltage of 100 V to the output terminal $D_O$. Since the gate signal of the IGBT 835 is at the L level (GND (0 V)) in FIG. 28 at this time, the IGBT 835 is turned off. (In the following descriptions, the L level is GND, that is 0 V.)

As the input signal shifts to the L level (at the time t11), the gate signal of the NMOS 831*c* in the level shifter circuit 831 is set at the H level, turning on the NMOS 831*c*, and the gate signal of the NMOS 831*d* is set at the L level, turning off the NMOS 831*d*. As a result, the PMOS 831*a* is turned off and the PMOS 831*b* is turned on. As a result, the gate signal of the IGBT 836 is set at the L level, turning off the IGBT 836. Since the gate signal inputted to the gate terminal of the IGBT 835 is set at the H level, the IGBT 835 is turned on and the output signal outputted from the output terminal $D_O$ falls to 0 V.

An improved conventional output stage circuit is disclosed in JP PHei.11(1999)-98000A (Paragraphs [0019] through [0023], FIGS. 1 and 2). The improved conventional output stage circuit disclosed in this patent publication slows down the rise of the output signal thereof (the current that the output stage circuit feeds) by clamping the voltage between the gate and the source of the FET connected between the high voltage supply terminal and the output terminal of the output stage for a certain period during the switching for preventing the noises due to too fast rise of the output signal thereof from causing device breakdown. JP P2001-134230A (FIG. 1) discloses a technique for obtaining a sufficient current driving capability even when the transistor connected between the output terminal and the reference voltage supply terminal is minimized to reduce the chip size.

FIG. 29 is a block circuit diagram of the other conventional output stage circuit in the display driver for driving the PDP. The output stage circuit 840 in FIG. 29 includes, in the same manner as the output stage circuit 830 in FIG. 27 does, a level shifter circuit 831 and IGBTs 835 and 836.

A Zener diode 844 and resistance 845 are connected between the gate and the emitter of the IGBT 836 connected to the high voltage supply terminal VDH. The Zener diode 844 is connected to prevent a voltage exceeding the breakdown voltage between the gate and the emitter of the IGBT 836 from being applied between the gate and the emitter of the IGBT 836. The resistance 845 is connected to boost the gate potential to the VDL level (5 V). Since a high voltage is not applied between the gate and the emitter of the IGBT 836 due to the Zener diode 844, the gate oxide film of the IGBT 836 in FIG. 29 may be formed to be thinner than the gate oxide film of the IGBT 836 in FIG. 27, and to be as thin as the gate oxide film of the IGBT 835. When the output stage circuit does not include any Zener diode 844 or resistance 845 as shown in FIG. 27, and therefore the gate oxide film of the IGBT 836 is thick, it is necessary to add a step for thickening the gate oxide film of the IGBT 836. If the gate oxide film of the IGBT 836 is formed at the same thickness as the gate oxide film thickness of the PMOSs 831*a* and 831*b* exhibiting a high breakdown voltage in the same manner as the IGBT 836, it will be necessary to enlarge the PMOSs 831*a* and 831*b*. However, when the Zener diode 844 and the resistance 845 are disposed as shown in FIG. 29, it becomes possible to form the gate oxide films of the IGBTs 836 and 835 at the same thickness. Therefore, the provision of the Zener diode 844 and the resistance 845 facilitates manufacturing the output stage circuit without either adding the step for thickening the gate oxide film of the IGBT 836 or widening the areas of the PMOSs 831*a* and 831*b*. An example of the output stage circuit 840 as described above is disclosed in JP P2000-164730A (FIG. 1).

The output stage circuit 840 operates in the same manner as the output stage circuit 830 illustrated in FIG. 27. The wiring pattern in the conventional display driver and the mounting thereof on a circuit board are described in detail in JP P2002-341785A.

When the output terminals $D_O1$ through $D_On$ in the conventional display driver are short-circuited by metal filings and other such foreign materials, an overcurrent is caused in connecting the power supply or during the operation. This further causes breakdown of the devices (IGBTs).

If the current density of the IGBTs is reduced so as not to cause breakdown of the IGBTs even when the caused short circuit continues for a long time, larger IGBTs will be needed for obtaining a current as high as necessary. These problems are caused also in driving flat panel display devices other than PDPs, such as liquid crystal displays and EL (electro-luminescent) displays.

In view of the foregoing, it would be desirable to obviate the problems described above. It would be also desirable to provide a display device driver circuit that facilitates preventing the constituent IGBTs from being broken down even when the output terminals thereof are short-circuited.

SUMMARY OF THE INVENTION

According to an aspect of the invention, there is provided an embodiment of a display device driver circuit for driving a flat panel display. The display device driver circuit includes output stage circuits. Each output stage circuit includes an input terminal, an output terminal, a high voltage supply terminal supplying a high voltage, a reference voltage supply terminal supplying a reference voltage, a first transistor electrically connected between the output terminal and the high voltage supply terminal, and a second transistor electrically connected between the output terminal and the reference voltage supply terminal. Each output stage circuit turns on the first transistor or the second transistor in response to an input signal inputted from the input terminal in synchronism with a clock signal to output an output signal from the output terminal thereof. The driver circuit also includes a timer circuit that outputs to the output stage circuits a control signal for turning off the first transistor and the second transistor when a next signal is not inputted thereto for a predetermined period of time after detecting the last clock signal. The output stage circuits turn off the first transistor and the second transistor in response to the control signal inputted from the timer circuit.

In the configuration described above, the timer circuit outputs to the output stage circuits the control signal for turning off the first and second transistors when a next clock signal is not inputted for a predetermined period of time after the last clock signal input, and the output stage circuits turn off the first and second transistors. As a result of these operations, the output terminals are put into a high impedance state.

According to another aspect of the invention, there is provided another embodiment of display device driver circuit for driving a flat panel display. This embodiment includes output stages that include elements like those of the previously described embodiment. Each of these output stage circuits turn on or off the first transistor or the second transistor in response to an input signal inputted from the input terminal in synchronism with a clock signal to output an output signal from the output terminal thereof. The display device driver circuit according to the second embodiment includes a control signal output circuit that outputs to the output stage circuits a control signal for putting the gate of the first transistor into a high impedance state after a predetermined period of time has elapsed since the last clock signal was detected.

In the configuration described above, the output stage circuits turn on or off the first transistor or the second transistor in response to the input signal inputted in synchronism with the clock signal and output an output signal from the output terminals thereof, and the control signal output circuit sends out to the output stage circuits a control signal for putting the gate of the first transistor into a high impedance state after a predetermined period of time has elapsed since detecting the last clock signal input. As a result, the gate of the first transistor is put into the high impedance state after a predetermined period of time has elapsed since the last detection of a clock signal by the control signal output circuit.

According to still another aspect of the invention, there is provided a further embodiment of a display device driver circuit for driving a flat panel display. This display device driver circuit includes a first transistor connected electrically between an output terminal and a high voltage supply terminal for supplying a high voltage, a second transistor connected electrically between the output terminal and a reference voltage supply terminal for supplying a reference voltage, and a level shifter circuit including third and fourth transistors. The third and fourth transistors determine the gate potential of the first transistor in response to an input signal inputted thereto in synchronism with a clock signal. The level shifter circuit simultaneously turning off the third and fourth transistors independently of the input signal when a control signal for putting the gate of the first transistor into a high impedance state is inputted to the level shifter circuit.

In the configuration described above, the level shifter circuit simultaneously turns off the third and fourth transistors independently of the input signal, when a control signal for putting the gate of the first transistor in a high impedance state is inputted to the level shifter circuit, and puts the gate of the first transistor into the high impedance state.

Since the first transistor connected between the output terminal and the high voltage supply terminal and the second transistor connected between the output terminal and the reference voltage supply terminal are turned off when the clock signal has delayed to put the output terminal into a high impedance state according to the invention, an overcurrent is prevented from flowing. This prevents the IGBTs from breaking down.

Moreover, an overcurrent is prevented from flowing since the gate of the first transistor connected between the output terminal and the high voltage supply terminal for supplying a high voltage is put into the high impedance state by the control signal. As a result, according to the display device driver circuit of the invention, the IGBTs are prevented from being broken down even when the output terminals are short-circuited.

Further, the IGBTs are prevented from breaking down, without reducing the current densities thereof. Therefore, the display device driver circuit according to the invention can be designed without widening the rear thereof, even when the output terminals are short-circuited.

DETAILED DESCRIPTION OF THE PREFERRED EMBODIMENTS

Figure 1:
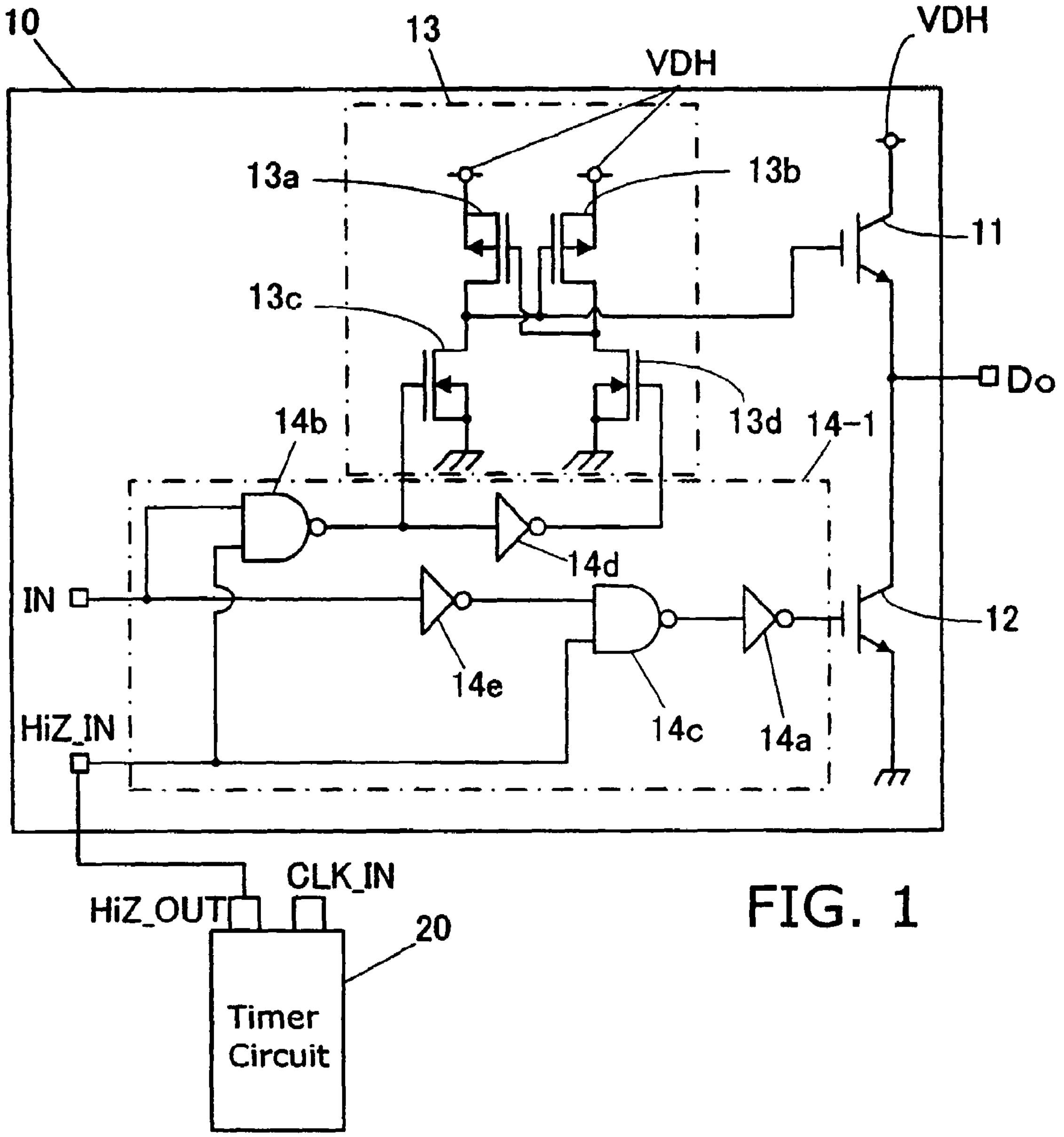
FIG. 1 is a block circuit diagram showing an output stage circuit and a timer circuit in a display device driver circuit according to a first embodiment of the invention.

Now the invention will be described in detail with reference to the accompanied drawing figures, which illustrate the preferred embodiments of the invention. First, a display device driver circuit according to a first embodiment of the invention will be described below. FIG. 1 is a block circuit diagram showing an output stage circuit and a timer circuit in a display device driver circuit according to the first embodiment.

The display driver according to the first embodiment includes output stage circuits 10 and a timer circuit 20. The output stage circuit 10 includes IGBTs 11 and 12, a level shifter circuit 13, and a logic circuit section 14-1. The logic circuit section 14-1 includes a buffer circuit 14*a*, NAND circuits 14*b*, 14*c*, and inverters 14*d*, 14*e*.

In the output stage circuit 10, the IGBT 11 is connected electrically between an output terminal $D_O$ and a high voltage supply terminal VDH for supplying a high voltage. The IGBT 12 is connected between the output terminal $D_O$ and a reference voltage supply terminal, here a ground terminal GND.

The output signal from the level shifter circuit 13 is inputted to the gate terminal of the IGBT 11. The output signal from the buffer circuit 14*a* is inputted to the gate terminal of the IGBT 12. The level shifter circuit 13 is formed of a PMOSs 13*a* and 13*b* exhibiting a high breakdown voltage and NMOSs 13*c* and 13*d*. The source terminal of the PMOS 13*a* is connected to the high voltage supply terminal VDH supplying a voltage between 0 V and 100 V. The drain terminal of the PMOS 13*a* is connected to the drain terminal of the NMOS 13*c*, the gate terminal of the PMOS 13*b*, and the gate terminal of the IGBT 11. The gate terminal of the PMOS 13*a* is connected to the drain terminals of the PMOS 13*b* and the NMOS 13*d*. In the same manner, the source terminal of the PMOS 13*b* is connected to the high voltage supply terminal VDH. The drain terminal of the PMOS 13*b* is connected to the drain terminal of the NMOS 13*d* and the gate terminal of the PMOS 13*a*. The gate terminal of the PMOS 13*b* is connected to the drain terminal of the PMOS 13*a*. The source terminals of the NMOSs 13*c* and 13*d* are connected to the reference voltage supply terminal GND. The output signal from the NAND circuit 14*b* is inputted to the gate terminal of the NMOS 13*c*. The output signal from the NAND circuit 14*b* is inputted to the gate terminal of the NMOS 13*d* via the inverter 14*d*.

The buffer circuit 14*a* inverts the level of the output signal from the NAND circuit 14*c* and inputs the inverted signal to the gate terminal of the IGBT 12.

The NAND circuit 14*b* performs a logic NAND operation on the input signal inputted to an input terminal IN and the control signal inputted to a control signal input terminal HiZ_IN, and outputs the result of the logic NAND operation. The NAND circuit 14*c* performs a logic NAND operation on the inverted signal obtained by inverting the input signal inputted to the input terminal IN in the inverter 14*e*, and the same control signal, and outputs the result of the logic NAND operation.

The timer circuit 20 detects a clock signal input to its clock signal input terminal CLK_IN, and sends out a control signal for turning off the IGBTs 11 and 12 in the output stage circuit 10 from a control signal output terminal HiZ_OUT when the next clock signal is not inputted for a predetermined period of time immediately following detection of the last clock signal. The configuration of the timer circuit 20 will be described in detail later.

Figure 25:
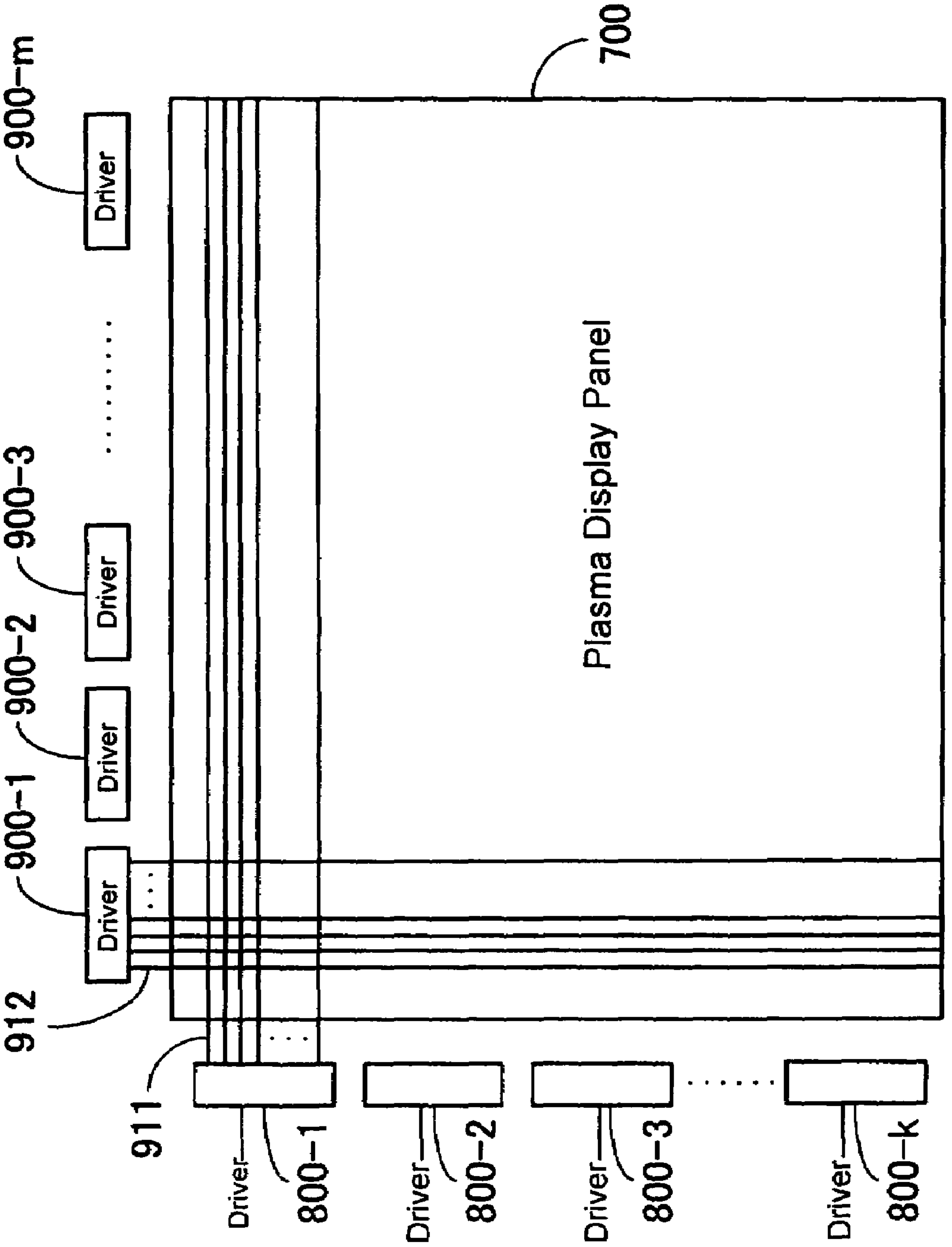
FIG. 25 is a block diagram schematically showing the structure of a PDP driver for driving a PDP.
Figure 26:
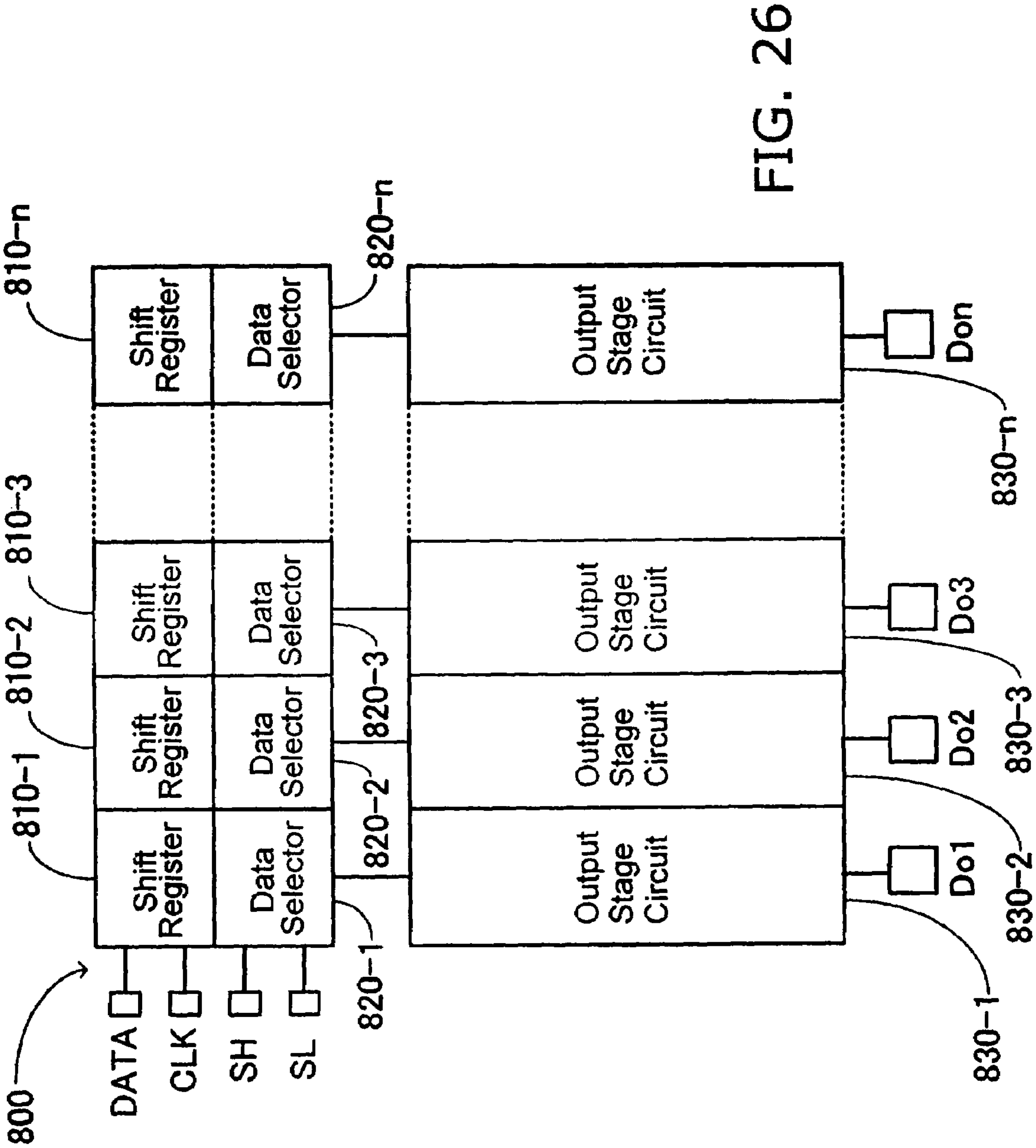
FIG. 26 is a block diagram of a conventional display device driver circuit.
Figure 27:
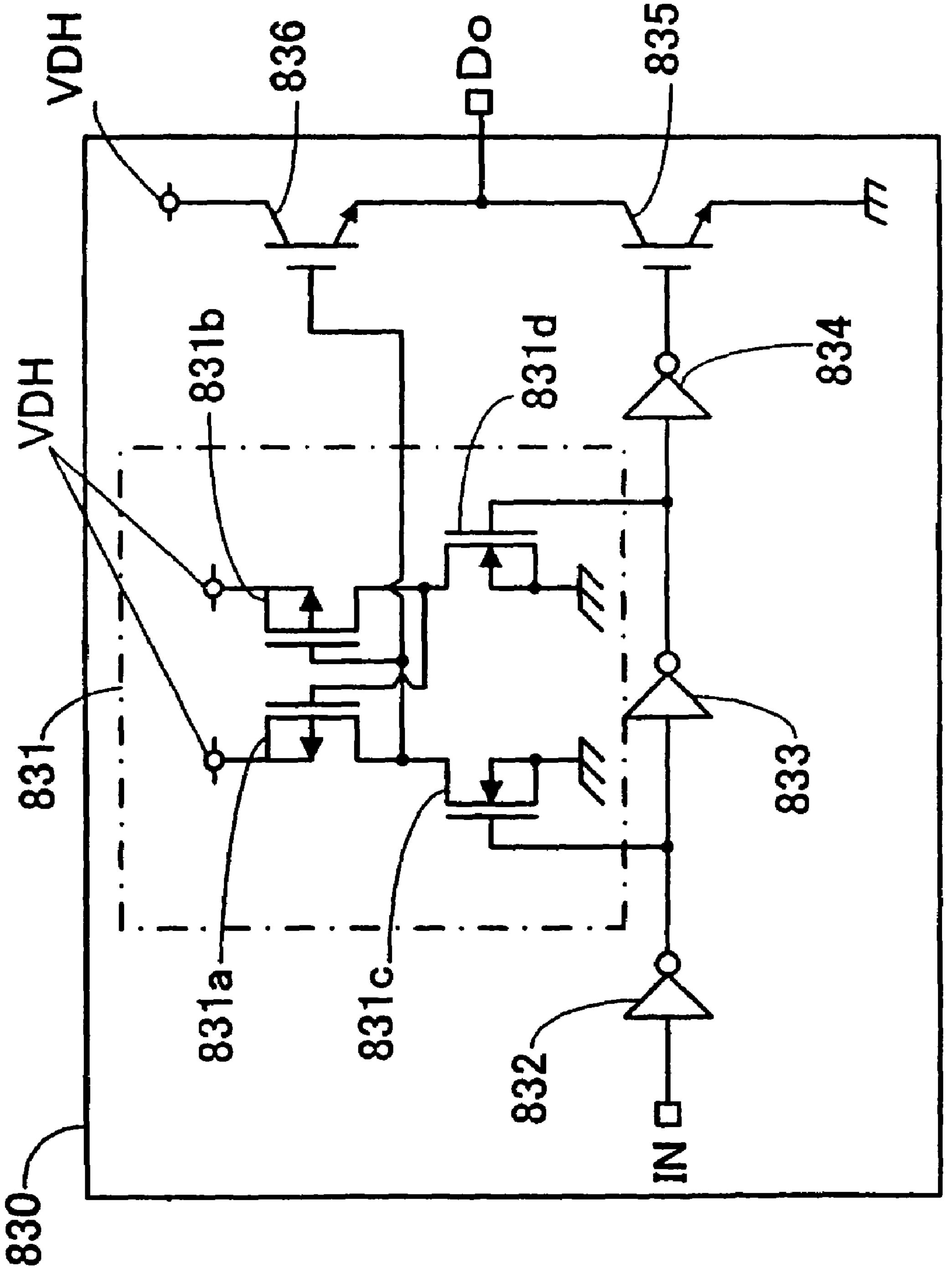
FIG. 27 is a block circuit diagram of the conventional output stage circuit in the display driver for driving the PDP.
Figure 28:
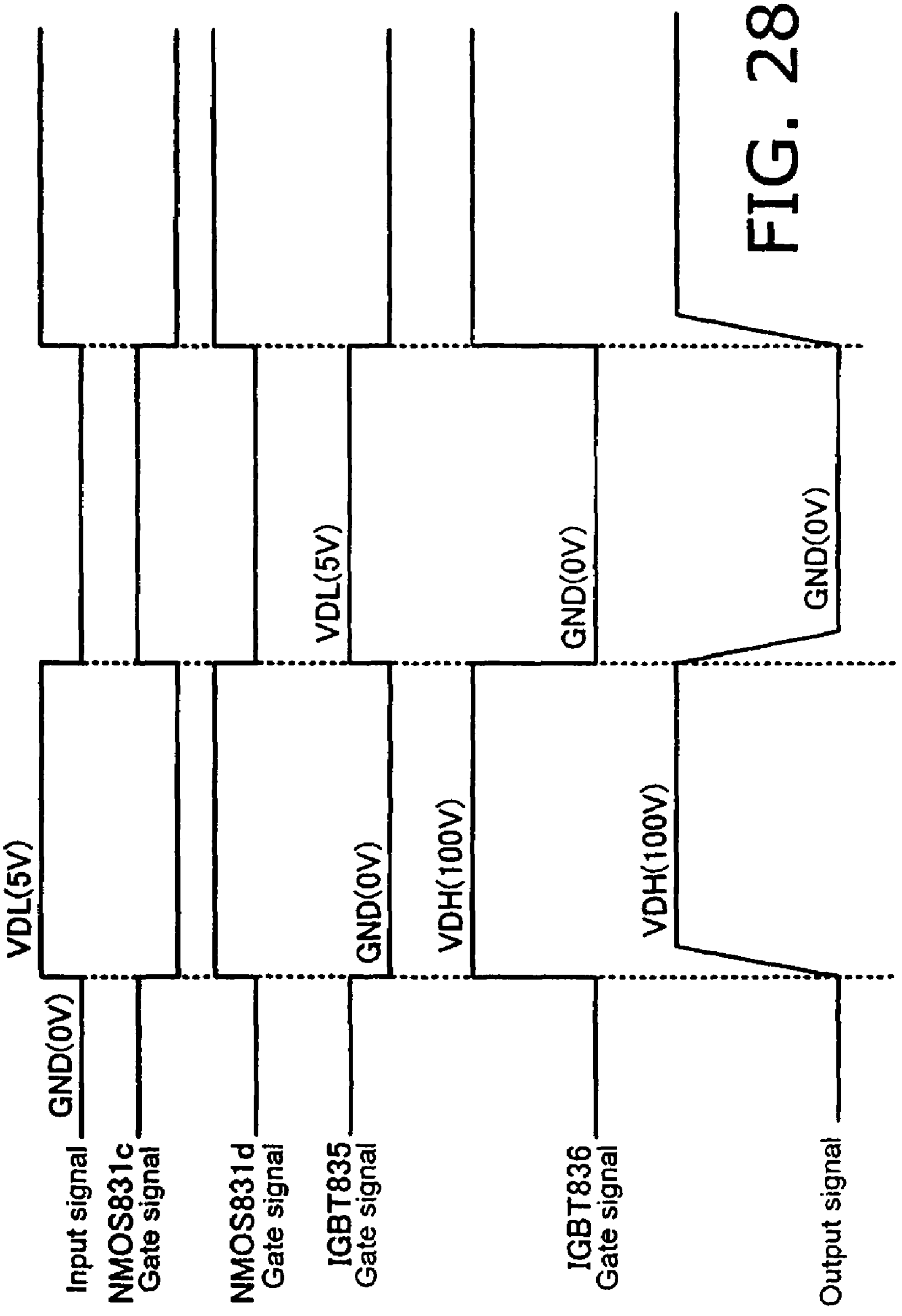
FIG. 28 is a timing chart illustrating the operations of a conventional output stage circuit.

The output terminal $D_O$ is connected to the scanning and holding electrodes 911 as is illustrated in FIG. 25. Now the operations of the circuits shown in FIG. 1 according to the first embodiment will be described.

In the initial state, the control signal is at the H level. As an input signal at the H level is inputted to the input terminal IN of the output stage circuit 10 in synchronism with the clock signal, the output from the NAND circuit 14*b* is set at the L level, turning off the NMOS 13*c* in the level shifter circuit 13, and a signal at the H level is inputted to the gate terminal of the NMOS 13*d*, turning on the NMOS 13*d*. As a result, the PMOS 13*a* is turned on and the gate signal inputted to the IGBT 11 is set at 100 V. The IGBT 11 turned on by the gate signal of 100 V outputs an output signal of 100 V to the output terminal $D_O$. Since the output from the NAND circuit 14*c* is at the H level at this time, the gate signal inputted to the gate terminal of the IGBT 12, which is obtained by inverting the H-level output signal from the NAND circuit 14*c* in the buffer circuit 14*a*, is set at the L level, turning off the IGBT 12.

Next, since it is necessary to set the scanning and holding electrodes 911 at the L level during writing of data by the data electrodes 912 (in the address discharge period), an input signal at the L level is inputted to the input terminal IN in synchronism with the clock signal. Since the output from the NAND circuit 14*b* is set at the H level at this time, NMOS 13*c* in the level shifter circuit 13 is turned on and a signal at the L level is inputted to the gate terminal of the NMOS 13*d*, turning off the NMOS 13*d*. As a result, the PMOS 13*a* is turned off and the PMOS 13*b* is turned on. This causes the gate signal inputted to the gate terminal of the IGBT 11 to be set at the L level, turning off the IGBT 11. The gate signal inputted to the gate terminal of the IGBT 12 is set at the H level, turning on the IGBT 12, and the output signal outputted from the output terminal $D_O$ is set at 0 V.

As described above, when the control signal input terminal HiZ_IN is at the H level, the IGBT 11 or 12 is turned on and correspondingly the IGBT 12 or 11 is turned off according to the input signal inputted in synchronism with the clock signal. Therefore, an output signal of 100 V or 0 V is outputted from the output terminal $D_O$.

Now the case in which the next clock signal is not inputted for a predetermined period of time after the detection of the last clock signal (for example upon connecting the power supply), will be described. When the next clock signal is not inputted for a predetermined period of time after the detection of the last clock signal, the timer circuit 20 sends a control signal set at the L level to the output stage circuit 10. Since the outputs from the NAND circuits 14*b* and 14*c* in the output stage circuit 10 are set at the H level independently of the input signal inputted from the input terminal IN, the IGBTs 11 and 12 are turned off, putting the output terminal $D_O$ into a high impedance state.

The output stage circuit 10 that operates as described above is disposed for every scanning and holding electrode of the PDP. When the output terminals $D_O$ of the conventional display driver happen to be connected electrically to each other (short circuited), the IGBTs 11 and 12 will be destroyed by an overcurrent if the clock signal is delayed longer than some period of time (hereinafter referred to as the "short circuit withstand capability"). In contrast, the display driver according to the first embodiment, which turns off the IGBTs 11 and 12 when the clock signal has been delayed and puts the output terminals $D_O$ into a high impedance state, prevents an overcurrent from flowing and the IGBTs 11 and 12 from being destroyed.

The short circuit withstand capability of the IGBTs 11 and 12 is designed to be longer than the address discharge period. The predetermined period of time set by the clock circuit 20 is shorter than the short circuit withstand capability of the IGBTs 11 and 12, but longer than the address discharge period, so that a discharge current may be made insufficient during the address discharge (the details of which will be described later).

Figure 2:
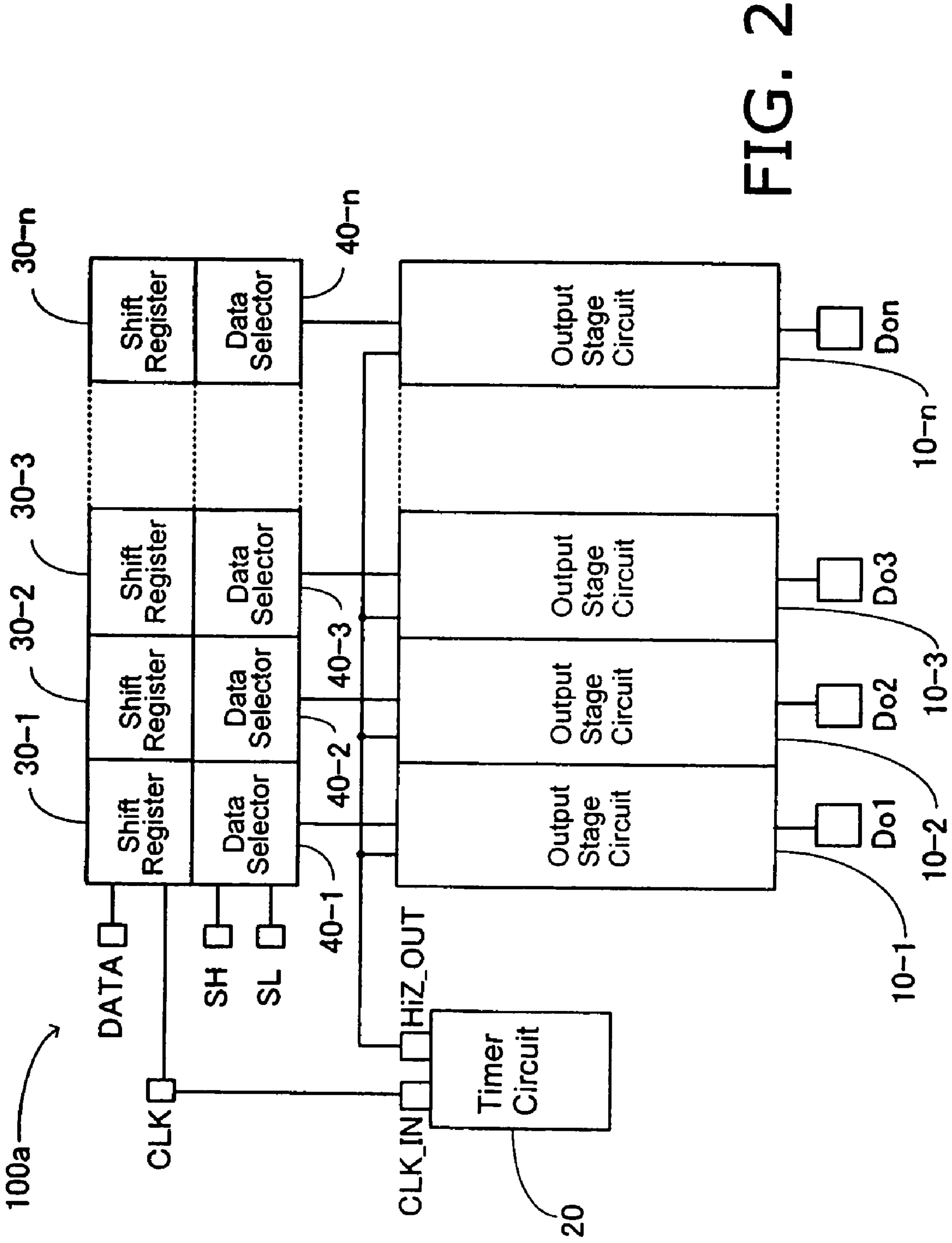
FIG. 2 is a block diagram of the display device driver circuit according to the first embodiment.

Now the display driver according to the first embodiment will be described in more detail. FIG. 2 is a block diagram of the display driver according to the first embodiment of the invention. Referring now to FIG. 2, the display driver 100*a* according to the first embodiment includes output stage circuits 10-1, 10-2, 10-3, . . . , and 10-n for a plurality of bits (e.g. 64 bits). Corresponding to the output stage circuits 10-1 through 10-n, the display driver 100*a* includes shift registers 30-1, 30-2, 30-3, . . . , and 30-n. The shift registers convert the serial signals controlling the scanning and holding electrodes 911 shown in FIG. 25 and inputted via a terminal DATA, to parallel signals synchronized with the clock signal inputted to a terminal CLK. The display driver 100*a* also includes data selectors 40-1, 40-2, 40-3, . . . , and 40-n, which send the signals transferred bit by bit from the shift registers 30-1, 30-2, 30-3, . . . , and 30-n to the output stage circuits 10-1, 10-2, 10-3, . . . , and 10-n. A terminal SH and a terminal SL are connected to the data selectors 40-1, 40-2, 40-3, . . . , and 40-n. An all-the-outputs H-level-fixing signal for fixing all the scanning and holding electrodes 911 at an H (high) level is inputted to the terminal SH. An all-the-outputs L-level-fixing signal for fixing all the scanning and holding electrodes 911 at an L (low) level is inputted to the terminal SL. One timer circuit 20 is provided commonly for all the output stage circuits 10-1 through 10-n for all the bits.

Figure 3:
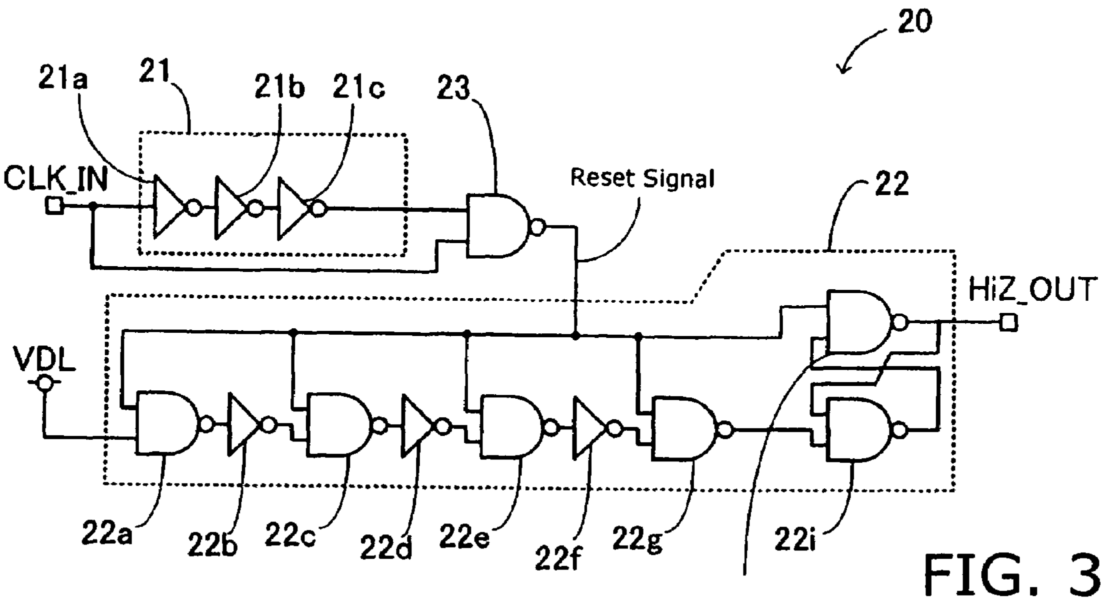
FIG. 3 is a block circuit diagram of the timer circuit.

The output stage circuits 10-1 through 10-n have the same structure as the output stage circuit 10 shown in FIG. 1. FIG. 3 is a block circuit diagram of the timer circuit.

The timer circuit 20 includes delay circuits 21 and 22 and a NAND circuit 23. The delay circuit 21 includes an odd number of inverters connected in series, e.g. inverters 21*a*, 21*b*, and 21*c*. Although three inverters 21*a*, 21*b*, and 21*c* connected in series are shown by way of example in FIG. 3, the number of the inverters may be selected appropriately to adjust the delay time. The delay time is set, for example, around 100 ns for the delay circuit 21.

The delay circuit 22 includes a low voltage supply terminal VDL, not shown in FIG. 2, for feeding a low voltage between 0 V and 5 V, a NAND circuit 22*a* connected to the low voltage supply terminal VDL via one of the input terminals thereof, a NAND circuit 22*c* connected to the output from the NAND circuit 22*a* via an inverter 22*b* and one of the input terminals thereof, a NAND circuit 22*e* connected to the output from the NAND circuit 22*c* via an inverter 22*d* and one of the input terminals thereof, and a NAND circuit 22*g* connected to the output from the NAND circuit 22*e* via an inverter 22*f* and one of the input terminals thereof. The delay circuit 22 further includes NAND circuits 22*h* and 22*i* constituting a flip-flop. The output from the NAND circuit 22*g* is inputted to one of the input terminals of the NAND circuit 22*i*, which is one of the input terminals of the flip-flop. The output from the NAND circuit 23, which is a reset signal, is inputted to the other input terminals of the NAND circuits 22*a*, 22*c*, 22*e*, 22*g* and the other input terminal of the flip-flop (which is one of the input terminals of the NAND circuit 22*h*). The control signal, which is the output from the timer circuit 20, is outputted from the NAND circuit 22*h* of the delay circuit 22 and sent from the control signal output terminal HiZ_OUT to the output stage circuits 10-1, 10-2, 10-3, . . . , and 10-n. For adjusting the delay time in the delay circuit 22, the number of the devices connected in series may be changed appropriately. For example, the delay time in the delay circuit 22 is set between 1.5 μs and 5 μs. The reason for this will be described later.

The NAND circuit 23 performs a logic NAND operation on the clock signal inputted from the clock signal input terminal CLK_IN and the signal obtained by delaying the clock signal in the delay circuit 21. The NAND circuit 23 outputs the result of the logic NAND operation to the delay circuit 22 as a reset signal.

Figure 4:
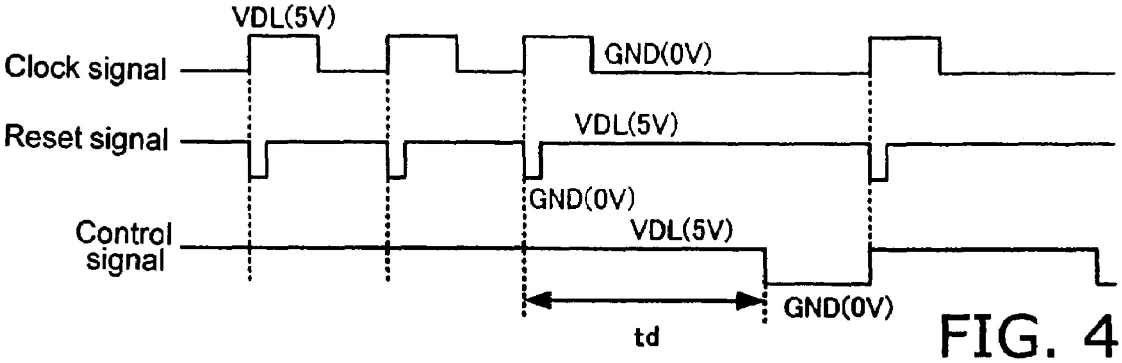
FIG. 4 is a timing chart illustrating the operations of the timer circuit.

Now the operations of the described above timer circuit 20 will be described below. FIG. 4 is a timing chart illustrating the operations of the timer circuit. FIG. 4 shows the voltage waveforms of the clock signal inputted to the clock signal input terminal CLK_IN, the reset signal that is output from the NAND circuit 23, and the control signal that is output from the timer circuit 20 and taken out from the control signal output terminal HiZ_OUT.

As the clock signal is inputted, the reset signal is set during the rising front thereof at the L level (GND (0 V) in FIG. 4) for the delay time of the delay circuit 21. In response to this, the control signal that is the output from the timer circuit 20 keeps an H level (VDL level (5 V) in FIG. 4). However, when no clock signal is inputted for a period longer than the delay time td set in the delay circuit 22, that is when no L-level reset signal is inputted to the delay circuit 22, the control signal is set at the L level.

Figure 5:
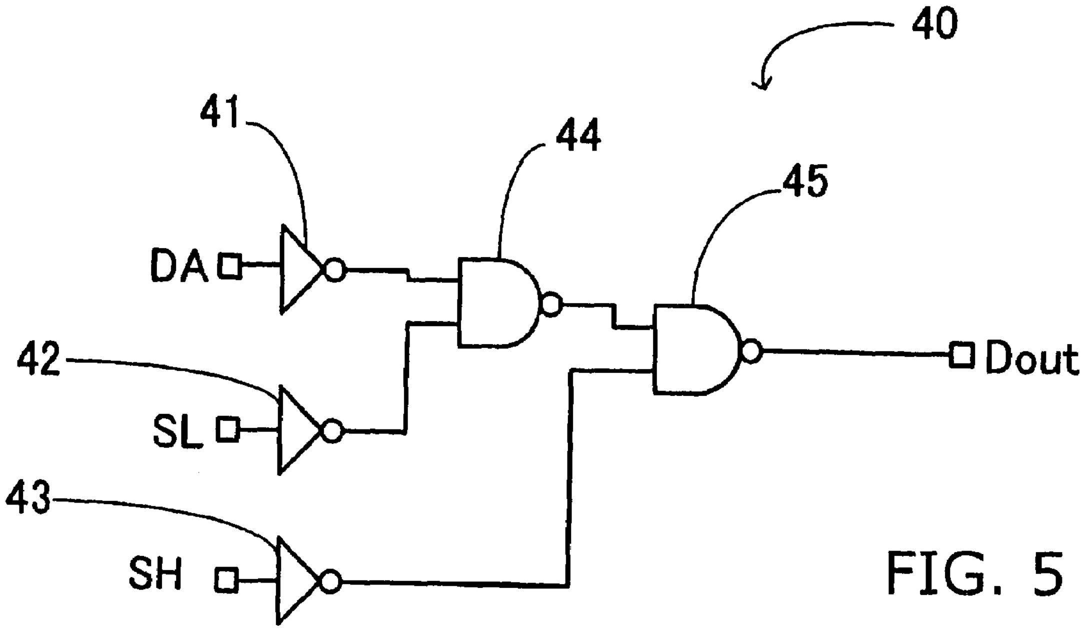
FIG. 5 is a block circuit diagram of the data selector.

Now, designating one of the data selectors 40-1 through 40-n by the reference numeral 40, the structure thereof will be described below as representative of the data selectors 40-1 through 40-n. FIG. 5 is a block circuit diagram of the data selector.

Referring to FIG. 5, the data selector 40 includes inverters 41, 42 and 43, and NAND circuits 44 and 45. The data inputted to a terminal DA from any of the shift registers 30-1 through 30-n is inputted to one of the input terminal of the NAND circuit 44 and the all-the-outputs L-level-fixing signal inputted to the terminal SL is inputted to the other input terminal of the NAND circuit 44 via the inverter 42. The output from the NAND circuit 44 is inputted to one of the input terminal of the NAND circuit 45 and the all-the-outputs H-level-fixing signal inputted to the terminal SH is inputted to the other input terminal of the NAND circuit 45 via the inverter 43. The output from the NAND circuit 45 is the output from the data selector 40, which is inputted to any of the input terminals IN of the output stage circuits 10-1, 10-2, 10-3, . . . , and 10-n.

Usually, the terminals SL and SH of the data selector 40 are at the L level. The signal obtained by inverting the level of the signal inputted to the terminal DA is transferred to the output terminal Dout. When the all-the-outputs H-level-fixing signal is set at the H level, the data selector 40 outputs an H-level signal to the output stage circuit 10-1, 10-2, 10-3, . . . , or 10-n independently of the signal inputted to the terminal DA. When the all-the-outputs L-level-fixing signal is set at the H level, the data selector 40 outputs an L-level signal to the output stage circuit 10-1, 10-2, 10-3, . . . , or 10-n independently of the signal inputted to the terminal DA. These signals are used in the discharge holding period.

Figure 6:
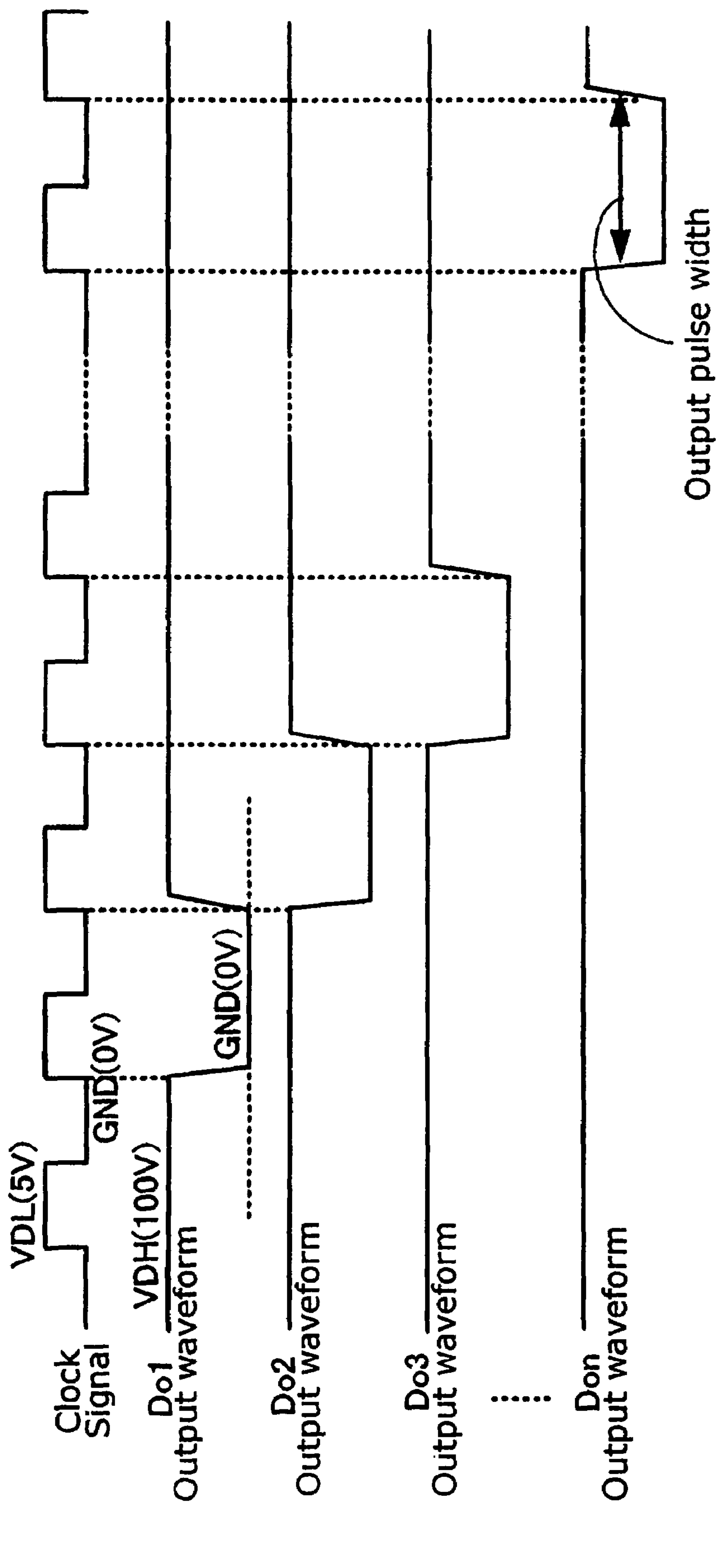
FIG. 6 is a timing chart illustrating the operations of the display device driver circuit operating normally.

FIG. 6 is a timing chart illustrating the operations of the display device driver circuit operating normally. FIG. 6 illustrates the clock signal inputted to the clock signal input terminal CLK_IN in the address discharge period and the output waveforms from the output terminals $D_O$1 through $D_O$n (the $D_O$1 output waveform through $D_O$n output waveform) of the output stage circuits 10-1 through 10-n.

At the time of address discharge, the signal inputted from the terminal DATA is shifted to the shift registers 30-1 through 30-n in synchronism with the rise of the clock signal, and inputted to the output stage circuits 10-1 through 10-n one by one. Therefore, the waveforms of the outputs from the output stage circuits 10-1 through 10-n fall one by one, and the period between the fall of the output wave and the rise of the input signal to the H level (the address discharge period) corresponds to the output pulse width. The input signal, not illustrated in FIG. 6, is set at the H level or the L level in synchronism with the rise of the clock signal.

Figure 7:
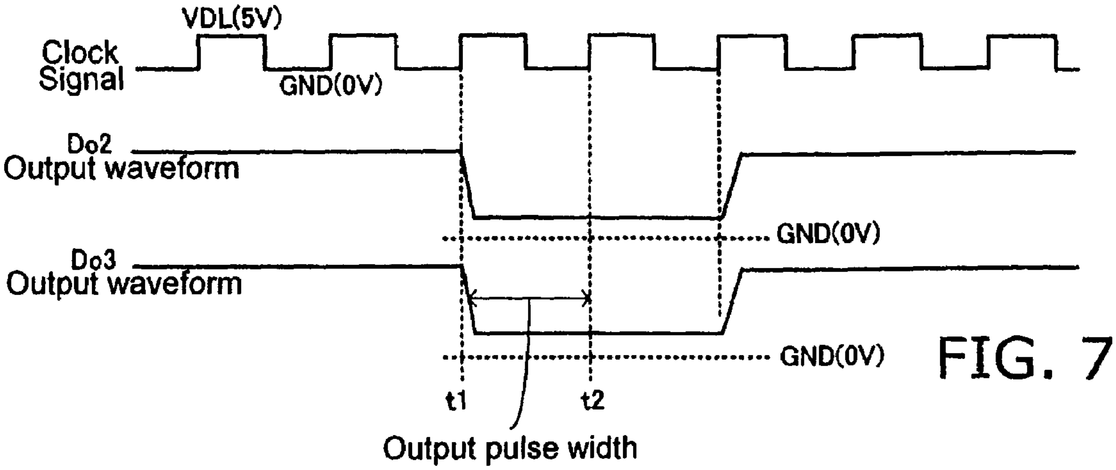
FIG. 7 is a wave chart illustrating the waveforms of the $D_O$2 output and the $D_O$3 output from the short-circuited output terminals $D_O$2 and $D_O$3.

Now the case in which the output terminals $D_O$2 and $D_O$3 are short-circuited by deposits will be described by way of example with reference to FIG. 7. FIG. 7 is a wave chart illustrating the waveforms of the $D_O$2 output and the $D_O$3 output from the short-circuited output terminals $D_O$2 and $D_O$3.

As the output from the output terminal $D_O$2 falls in synchronism with the clock signal when the output terminals $D_O$2 and $D_O$3 are short-circuited, the output terminal $D_O$3 is also biased at the same potential at the same time (at the time t1 in FIG. 7). In this instance, the IGBT connected to the reference voltage supply terminal GND of the output stage circuit 10-2 and the IGBT connected to the high voltage supply terminal VDH of the output stage circuit 10-3 are short-circuited (cf. FIG. 1). Therefore, the falling potential stops falling at a level a little bit higher than the GND level (0 V) by the voltage drop across the IGBT connected to the high voltage supply terminal VDH. As the next clock signal is inputted (at the time t2 in FIG. 7), the IGBT connected to the high voltage supply terminal VDH of the output stage circuit 10-2, and the IGBT connected to the reference voltage supply terminal GND of the output stage circuit 10-3 are short-circuited. Therefore, the falling potential stops falling at a level a little bit higher than the GND level (0 V) by the voltage drop across the IGBT connected to the high voltage supply terminal VDH.

In FIG. 7, when the clock signal is operating normally and the output pulse widths of the $D_O$2 and $D_O$3 output waveforms for one clock pulse do not exceed the short circuit withstand capability of the IGBTs (around 10 μs) used in the output stage circuits 10-1 through 10-n, the IGBTs will work without breaking down, since the IGBTs that will operate are changed over.

Now the output waveforms from the output terminals $D_O$2 and $D_O$3, which are short-circuited when the clock signal is not inputted normally to the display driver 100_a_ upon connecting the power supply, and the timing thereof, will be described. For the sake of comparison, the output waveforms from the conventional output stage circuit are described first.

Figure 8:
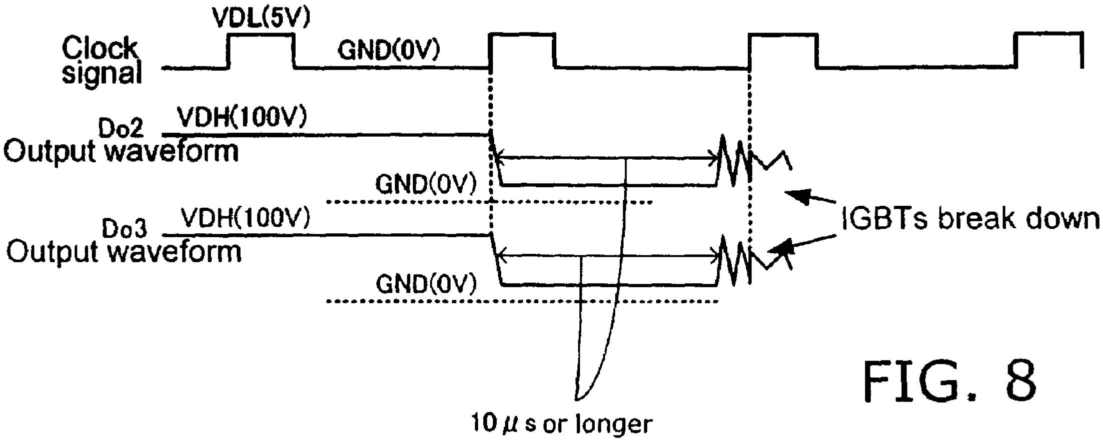
FIG. 8 is a wave chart illustrating the output waveforms from the short-circuited output terminals $D_O$2 and $D_O$3 in the conventional display device driver circuit when the clock signal is delayed.

FIG. 8 is a wave chart illustrating the output waveforms from the short-circuited output terminals $D_O$2 and $D_O$3 in the conventional display driver when the clock signal is delayed. When the output terminals $D_O$2 and $D_O$3 are short-circuited, the IGBTs will break down if the clock signal is delayed for a period longer than the short circuit withstand capability of the IGBTs (around 10 μs) used in the output stage circuits 10-1 through 10-n.

Figure 9:
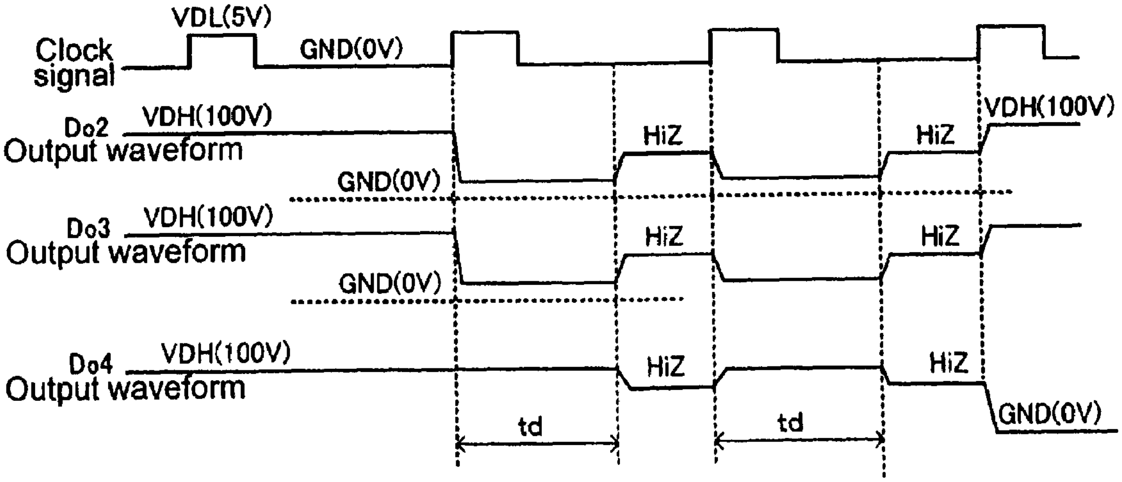
FIG. 9 is a wave chart illustrating the output waveforms from the terminals $D_O$2, $D_O$3 and $D_O$4 in the display device driver circuit according to the first embodiment of the invention when the clock signal is delayed.

FIG. 9 is a wave chart illustrating the output waveforms from the short-circuited terminals $D_O$2, $D_O$3 and the terminal $D_O$4 in the display device driver circuit according to the first embodiment of the invention, when the clock signal is delayed. In the display driver 100_a_ according to the first embodiment, a control signal at the L level is inputted to all the output stage circuits 10-1 through 10-n when the delay time td set in the delay circuit 22 of the timer circuit 20 (cf. FIG. 3) has elapsed. The L-level control signal turns off the IGBTs 11 and 12 in the output stage circuits 10-1 through 10-n, and the $D_O$1 through $D_O$n output waveforms from the output terminals $D_O$1 through $D_O$n are set at an HiZ level, which is, for example, an intermediate level (around 50 V). (Only the $D_O$2, $D_O$3 and $D_O$4 output waveforms are shown by way of example in FIG. 9.). As a result, the short-circuited output terminals $D_O$2 and $D_O$3 are put into a high impedance state at the delay time td even if the clock signal has been delayed for a period longer than the short circuit withstand capability of the IGBTs 11 and 12 (around 10 μs). Therefore, an overcurrent is prevented from flowing, and the IGBTs 11 and 12 are prevented from being broken down.

The next control signal returns to the H level when the clock signal is inputted after the last output of the control signal. Therefore, the IGBTs 11 and 12 in the output stage circuits 10-1 through 10-n resume normal operations, in which one of the IGBTs 11 and 12 is turned on and the other one of the IGBTs 11 and 12 is turned off in response to the input signal.

It is necessary to set the delay time td to be longer than the address discharge period, so that a sufficient discharge current may be made to flow in the address discharge period, but to be shorter than the short circuit withstand capability of the IGBTs 11 and 12. When the address discharge period is 1.3 μs and the short circuit withstand capability of the IGBTs 11 and 12 is 10 μs, it is preferable to set the delay time td between 1.5 μs and 5.0 μs.

For adjusting the delay time td as described above, the number of devices connected in series in the delay circuit 22 of the timer circuit 20 is adjusted. Alternatively, the delay time td may be adjusted using resistance and capacitance as described below.

Figure 10:
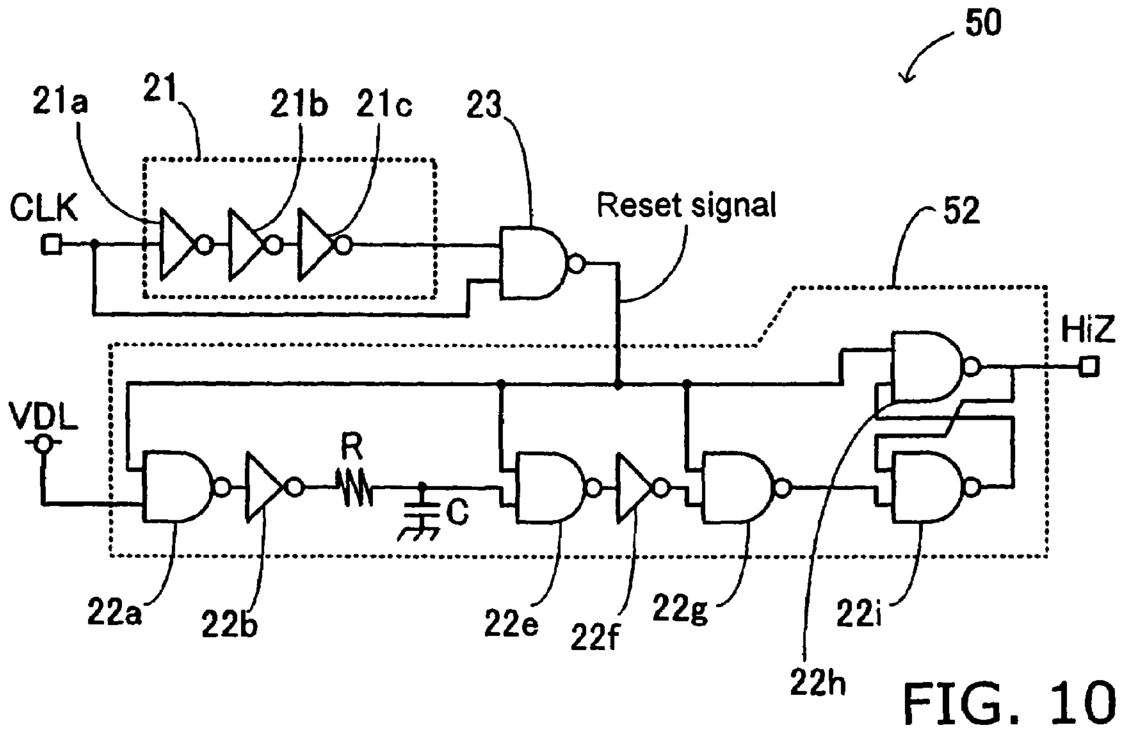
FIG. 10 is a block circuit diagram of the timer circuit.

FIG. 10 is a block circuit diagram of the timer circuit in which the delay time td may be adjusted using resistance and capacitance. The same reference numerals as used in FIG. 3 to designate the constituent elements of the timer circuit 20 are used to designate the same constituent elements in FIG. 10. The timer circuit 50 shown in FIG. 10 includes a delay circuit 52 that uses a resistance R and a capacitance C for determining the delay time td. In the delay circuit 52, one end of the capacitance C is grounded. The resistance R and the capacitance C are connected between the output terminal of the inverter 22_b_ in the front stage, and one of the input terminals of the NAND circuit 22_e_, in place of the NAND circuit 22_e_ and the inverter 22_d_ in the delay circuit 22 shown in FIG. 3. Multiple delay circuits, each including the resistance R and the capacitance C connected as described above, may be connected in series.

Figure 11:
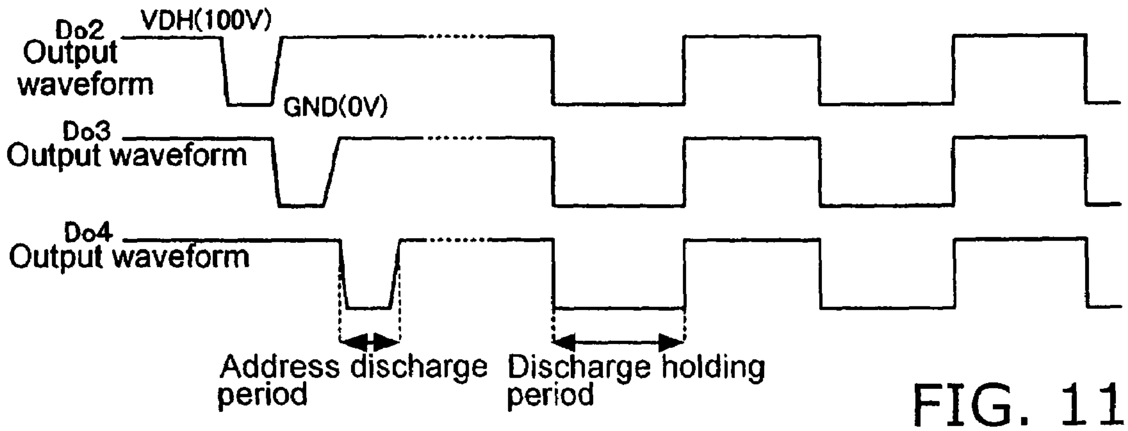
FIG. 11 is a wave chart illustrating the waveforms on the scanning and holding electrodes of the PDP.

FIG. 11 is a wave chart illustrating the waveforms on the scanning and holding electrodes of the PDP. As illustrated in FIG. 11, a discharge holding period is set by the all-the-outputs H-level-fixing signal or by the all-the-outputs L-level-fixing signal after the address discharge period, in synchronism with the clock signal.

During the discharge holding period, the all-the-outputs L-level-fixing signal (H level) is inputted from the terminal SL to make the $D_O$1 through $D_O$n waveforms fall as described in connection with the data selector 40 illustrated in FIG. 5. (In FIG. 11, by way of example, only the $D_O$2 through $D_O$4 waveforms are shown.). Although short circuiting of the output terminals $D_O$1 through $D_O$n during the address discharge period is described above, it is necessary to set the delay time td to be longer than the address discharge period but shorter than the short circuit withstand capability of the IGBTs, considering the short circuit with the power supply. The reason for this is described below. If the all-the-outputs H-level-fixing signal or the all-the-outputs L-level-fixing signal does not work (is not provided) for a certain period when a short circuit with the power supply occurs, the constituent IGBTs may break down even during the discharge holding period. A timer circuit for detecting the all-the-outputs H-level-fixing signal or the all-the-outputs L-level-fixing signal will be described below.

Figure 12:
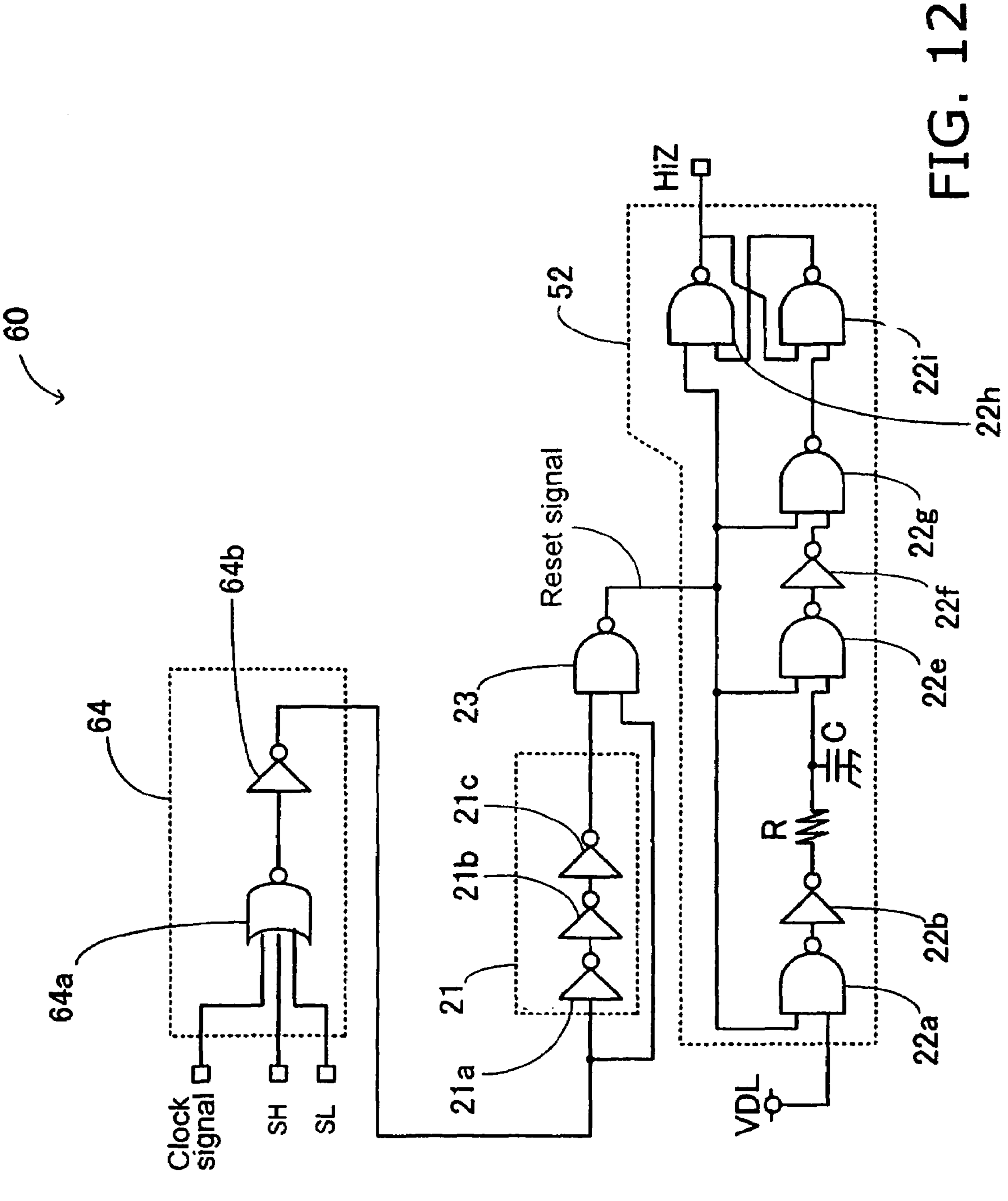
FIG. 12 is a block circuit diagram of the timer circuit for detecting the all-the-outputs H-level-fixing signal or the all-the-outputs L-level-fixing signal.

FIG. 12 is a block circuit diagram of a timer circuit 60 for detecting the all-the-outputs H-level-fixing signal or the all-the-outputs L-level-fixing signal.

Referring to FIG. 12, the timer circuit 60 includes an OR circuit 64 having a NOR circuit 64*a* and an inverter 64*b*. The clock signal is inputted to the NOR circuit 64*a*. The all-the-outputs H-level-fixing signal is inputted to the NOR circuit 64*a* via the SH terminal. The all-the-outputs L-level-fixing signal is inputted to the NOR circuit 64*a* via the SL terminal. Since the other constituent elements are the same as those in the timer circuit of FIG. 10, the same reference numerals as used in FIG. 10 are used to designate the same constituent elements, and what would be duplicative descriptions of these elements are omitted for the sake of simplicity. The delay circuit 62 sets the delay time td to be longer than the address discharge period but shorter than the short circuit withstand capability of the IGBTs.

The configuration described above facilitates outputting a control signal at the L level to the output stage circuits 10-1 through 10-n when the clock signal, the all-the-outputs H-level-fixing signal, or the all-the-outputs L-level-fixing signal does not work (is not provided) for a period longer than the delay time td set by the delay circuit 52. Therefore, the configuration described above facilitates putting all the output terminals $D_O$1 through $D_O$n into a high impedance state and preventing breakdown of the IGBTs due to a short circuit with the power supply VDH.

Figure 13:
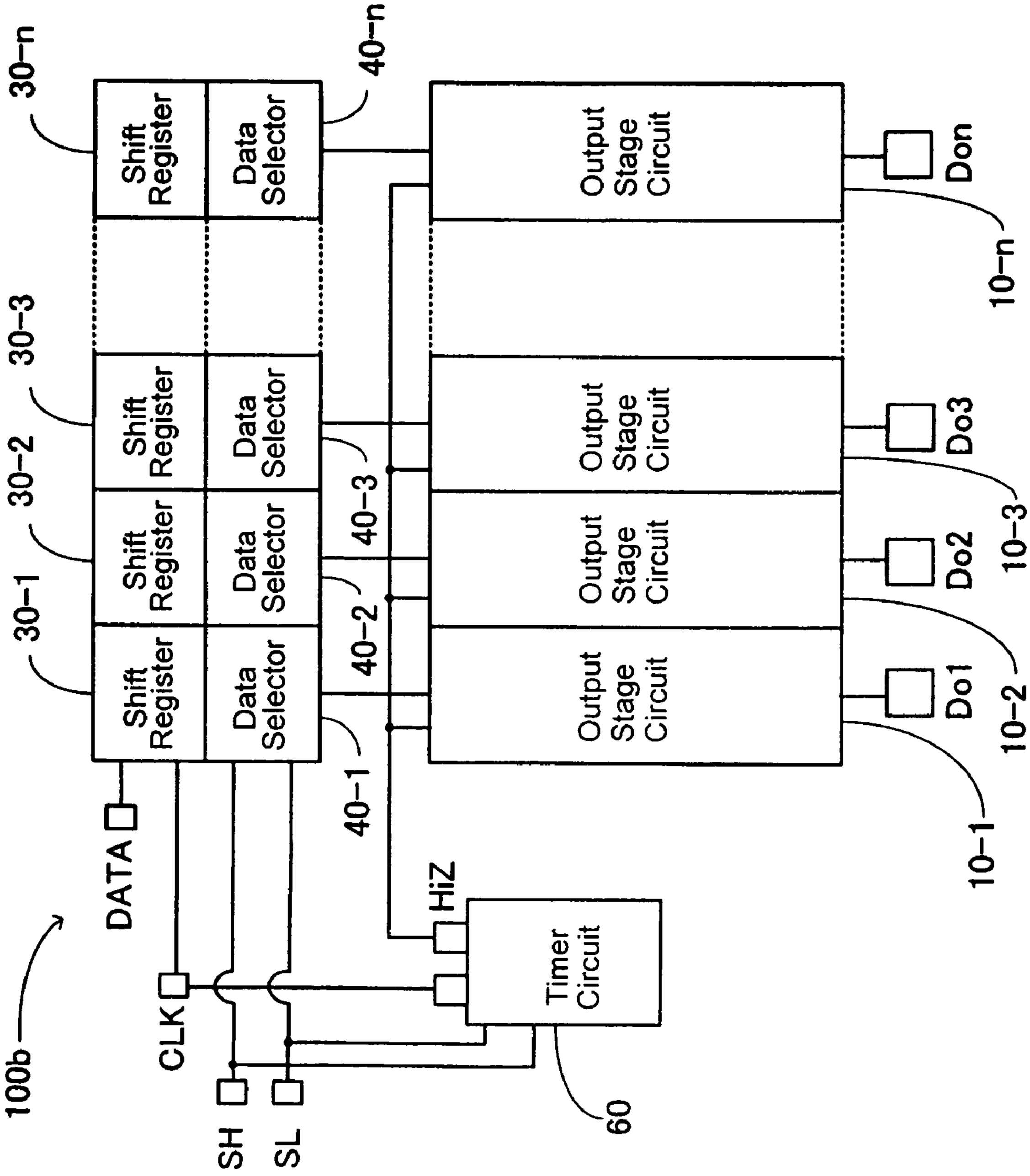
FIG. 13 is a block diagram of the display device driver circuit that employs the timer circuit shown in FIG. 12.

FIG. 13 is a block diagram of a display device driver circuit 100*b* that employs the timer circuit 60 shown in FIG. 12. In the display driver 100*b* shown in FIG. 13, the timer circuit 60 is connected to the terminals SH and SL connected to the data selectors 40-1 through 40-n.

Figure 29:
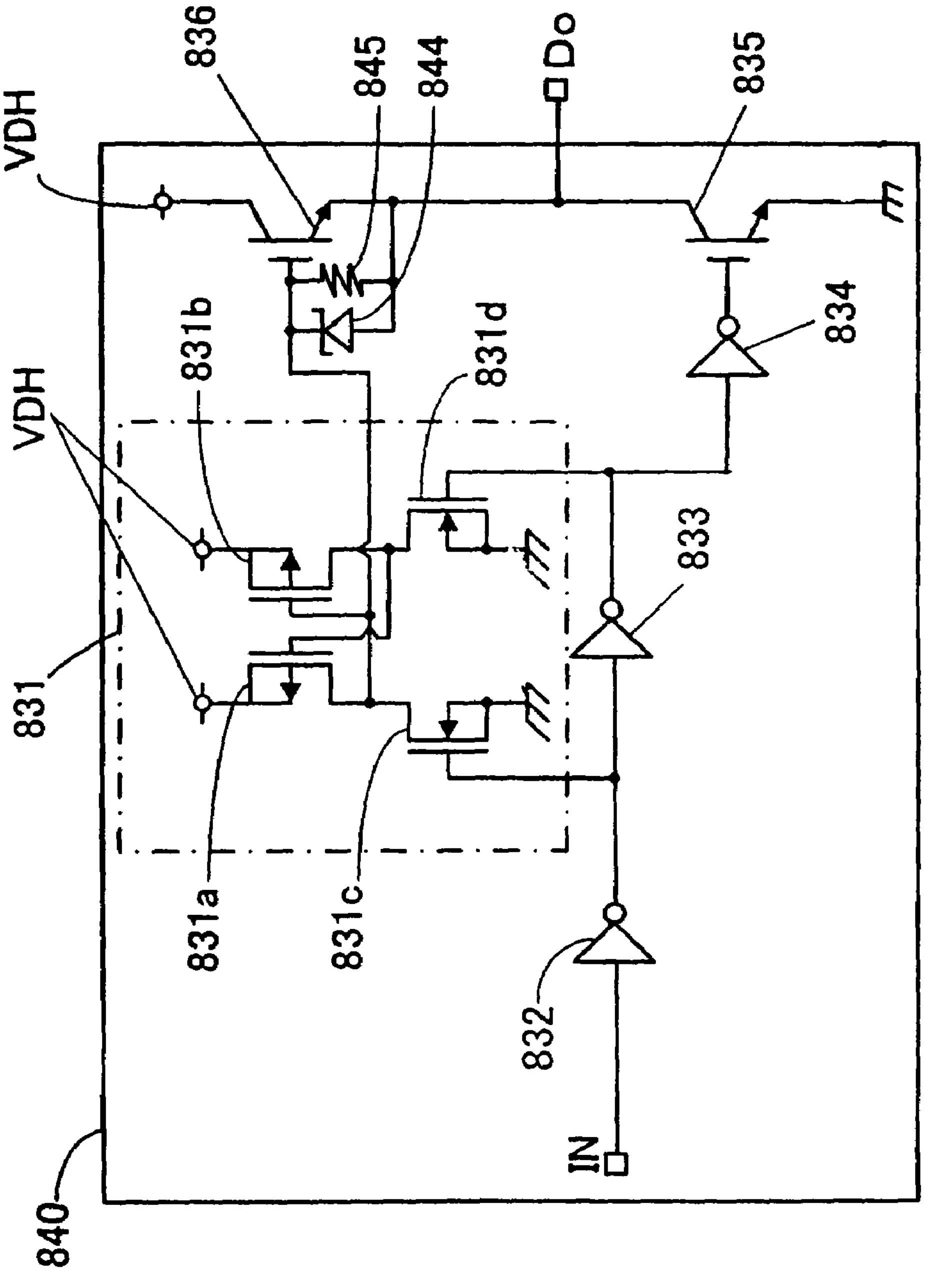
FIG. 29 is a block circuit diagram of another conventional output stage circuit in the display driver for driving the PDP.

Alternatively, a Zener diode may be connected between the gate and the emitter of the IGBT 11, as shown in FIG. 29. This connection facilitates thinning the gate oxide film of the IGBT 11. Although both of the IGBTs 11 and 12 are turned off when the control signal input terminal HiZ_IN is at the L level, the output terminal $D_O$ is set at the L level, since the gate potential of the IGBT 11 is at the L level. Since the control signal is inputted according to the first embodiment when the clock signal does not work normally, the output terminal $D_O$ is set at the L level with no problem and no adverse affect on the normal operations.

As described above, the display device driver circuit according to the first embodiment facilitates preventing the IGBTs 11 and 12 from being broken down, without reducing the current density thereof even when the output terminals $D_O$1 through $D_O$n are short-circuited. Therefore, the display device driver circuit for driving the PDPs is designed without widening the area thereof.

Figure 14:
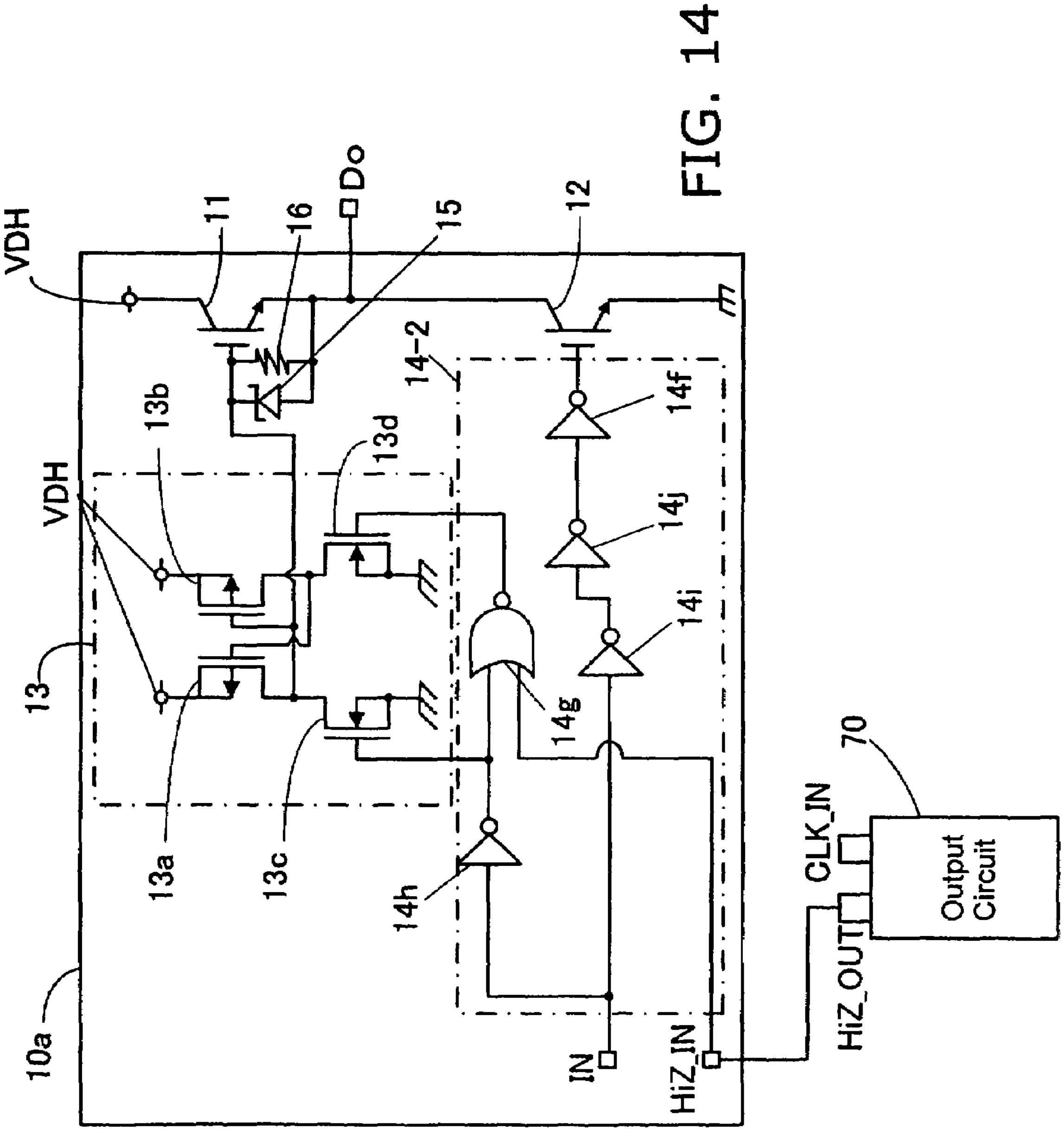
FIG. 14 is a block circuit diagram showing an output stage circuit and a control signal output circuit in a display device driver circuit according to a second embodiment of the invention.

Now a display device driver circuit according to a second embodiment of the invention will be described. FIG. 14 is a block circuit diagram showing an output stage circuit and a control signal output circuit in a display device driver circuit according to the second embodiment. The display device driver circuit according to the second embodiment includes output stage circuits 10*a*, each including IGBTs 11 and 12, a level shifter circuit 13, and a logic circuit section 14-2. The display driver according to the second embodiment also includes a control signal output circuit 70, which differs from any of the timer circuits 20, 50, and 60 described above with respect to the display driver according to the first embodiment.

The level shifter circuit 13 according to the second embodiment is the same as the level shifter circuit in the display driver according to the first embodiment. Therefore, the same reference numerals as used to designate the level shifter circuit and their constituent elements in the display driver according to the first embodiment are used also to designate the level shifter circuit and their constituent elements in the display driver according to the second embodiment, and what would be duplicative descriptions of these elements are omitted. Differently from the logic circuit section 14-1, the logic circuit section 14-2 is formed of a buffer circuit 14*f*, a NOR circuit 14*g*, and inverters 14*h*, 14*i*, and 14*j*.

The input signal inputted to an input terminal IN is inputted to the buffer circuit 14*f* via inverters 14*i* and 14*j*. The buffer circuit 14*f* inverts the level of the input signal, and outputs the level-inverted input signal to the gate terminal of the IGBT 12. The input signal inputted to the input terminal IN is inputted also to the NOR circuit 14*g* via the inverter 14*h*. The NOR circuit 14*g* performs a logic NOR operation upon the level-inverted input signal and the control signal inputted to the control signal input terminal HiZ_IN. The NOR circuit 14*g* outputs the result of the logic NOR operation to the gate terminal of the NMOS 13*d* in the level shifter circuit 13. The output from the inverter 14*h* is inputted also to the gate terminal of the NMOS 13*c*.

A Zener diode 15 and resistance 16 are connected between the gate and the emitter of the IGBT 11. The Zener diode 15 is connected for preventing a voltage higher than the breakdown voltage between the gate and the emitter of the IGBT 11 from being applied. The resistance 16 is connected for boosting the gate potential to the VDL level (5 V).

In the output stage circuit 10*a*, the gate potential of the IGBT 11 is determined by the signal inputted to the gate terminals of the NMOSs 13*c* and 13*d* in the level shifter circuit 13. Among the NMOSs 13*c* and 13*d*, the NMOS 13*d* is controlled especially by the control signal.

The control signal output circuit 70 delays the clock signal inputted from the clock signal input terminal CLK_IN thereof. It also generates a control signal for putting the gate of the IGBT 11 into a high impedance state after a predetermined period has elapsed from the detection of the last clock signal inputted thereto, and outputs the control signal from the control signal output terminal HiZ_OUT thereof. The predetermined period is a period in the rise of the output signal from the output terminal $D_O$, e.g. the period from the time at which the gate potential of the IGBT 11 (the output from the level shifter circuit 13) is set at the H level, until the time at which the output signal from the output terminal $D_O$ is fixed finally at the H level. The structure of the control signal output circuit 70 will be described in detail later.

The output terminal $D_O$ is connected to the scanning and holding electrodes 911 as shown in FIG. 25, and further to the discharge cells. Now the operations of the output stage circuit and the control signal output circuit shown in FIG. 14 according to the second embodiment will be described with reference also to FIG. 15.

Figure 15:
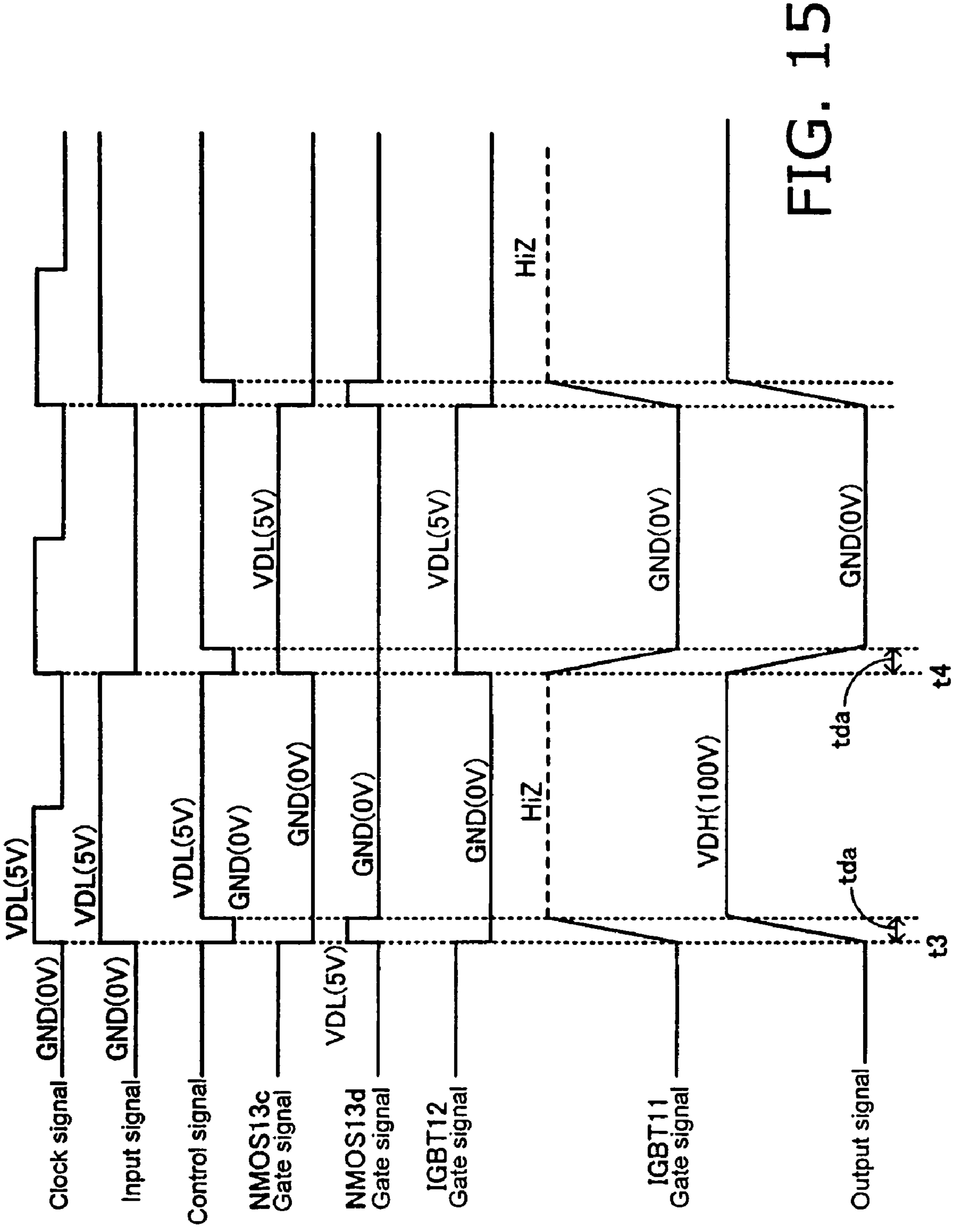
FIG. 15 is a timing chart illustrating the operations of the output stage circuit and the control signal output circuit shown in FIG. 14 according to the second embodiment.

FIG. 15 is a timing chart of the operations of the output stage circuit and the control signal output circuit shown in FIG. 14 according to the second embodiment. Referring to FIG. 15, as the input signal is set at the H level in synchronism with the clock signal (at the time t3), the control signal output circuit 70 outputs an L-level control signal. The input signal to the output stage circuit 10*a* is inverted by the inverter 14*h*, and the gate signal of the NMOS 13*c* in the level shifter circuit 13 is set at the L level, turning off the NMOS 13*c*. The output from the NOR circuit 14*g* is set at the H level. Since the output from the NOR circuit 14*g* set at the H level works as the gate signal of the NMOS 13*d*, the NMOS 13*d* is turned on. And, the PMOS 13*a* is turned on and the PMOS 13*b* is turned off. As a result, the output from the level shifter circuit 13 rises to the voltage at the high voltage supply terminal VDH (100 V), this voltage hereinafter being referred to as "the VDH level". Since the output from the level shifter circuit 13 works as the gate signal of the IGBT 11, the IGBT 11 is turned on. On the other hand, when the input signal is at the H level, the gate signal of the IGBT 12 is set at the L level via the inverters 14*i*, 14*j* and the buffer circuit 14*f*, turning off the IGBT 12. By the operations described so far, the output signal from the output stage circuit 10*a* rises to the VDH level. During the rise of the output signal, the control signal output circuit 70 generates, after a predetermined delay time tda has elapsed, a control signal for putting the gate of the IGBT 11 into a high impedance state, and outputs the generated control signal from the control signal output terminal HiZ_OUT. In detail, the control signal is set at the H level after the delay period, e.g. 200 ns, for which period the gate signal of the IGBT 11 keeps rising to the VDH level, has elapsed. As a result, the output from the NOR circuit 14*g* is set at the L level and the gate signal of the NMOS 13*d* in the level shifter circuit 13 is set at the L level, turning off the NMOS 13*d*. Since the input signal from the input terminal IN is at the H level at this time, the NMOS 13*c* is also OFF. Therefore, the gate of the IGBT 11 is put into a high impedance state (the gate potential at an HiZ level). While the gate of the IGBT 11 is in the high impedance state, each of the constituent circuit devices in the level shifter circuit 13 holds the level thereof by the capacitance thereof, keeping the output from the IGBT 11 ON.

Then, as the input signal from the input terminal IN is set at the L level in synchronism with the lock signal (at the time t4), the control signal is set also at the L level, and the input signal is inverted by the inverter 14*h*. As a result, the gate signal of the NMOS 13*c* in the level shifter circuit 13 is set at the H level, turning on the NMOS 13*c*. On the other hand, since the output from the NOR circuit 14*g* is set at the L level, the gate signal of the NMOS 13*d* is kept at the L level, keeping the NMOS 13*d* off. And, the PMOS 13*a* is turned off and the PMOS 13*b* is turned on. As a result, an L-level signal is outputted from the level shifter circuit 13. Since the outputted L-level signal works as the gate signal of the IGBT 11, the IGBT 11 is turned off. When the input signal is at the L level, the gate signal of the IGBT 12 is set at the H level via the inverters 14*i*, 14*j* and the buffer circuit 14*f*. Therefore, the IGBT 12 is turned on and the output signal from the output stage circuit 10*a* falls to 0 V. Although the control signal is set at the H level after the delay time tda has elapsed, the output from the NOR circuit 14*g* (the gate signal of the NMOS 13*d*) keeps the L level, since the input signal is at the L level.

Figure 16:
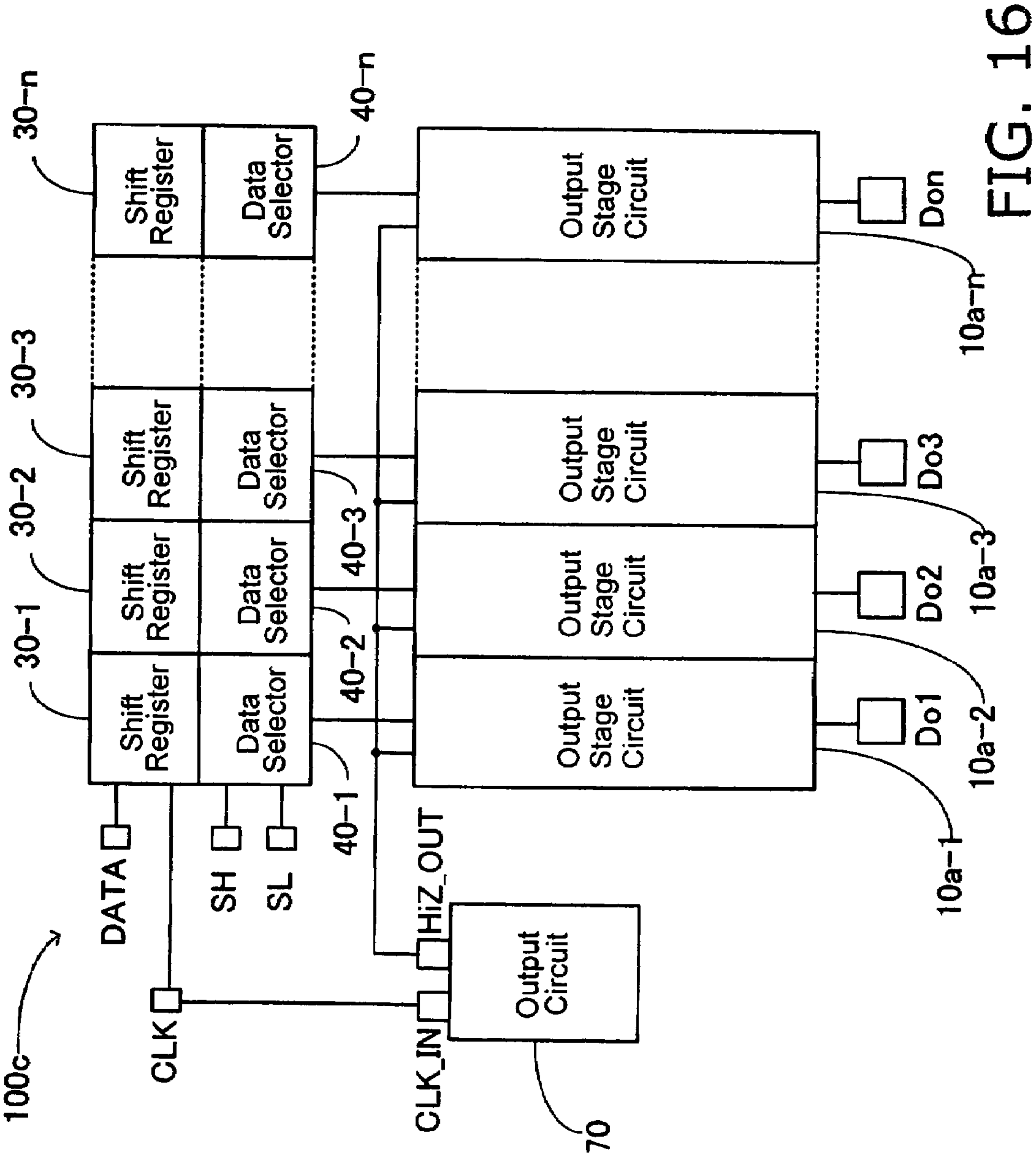
FIG. 16 is a block diagram of the display driver according to the second embodiment of the invention.

The output stage circuit 10*a* that works as described above is disposed for every scanning and holding electrode of the PDP as described later with reference to FIG. 16. By using the output stage circuit described with reference to FIG. 14, the gate potential of the IGBT 11 is affected by the potential of the output terminal $D_O$ and made to fall and, therefore, the IGBT 11 is turned off even when a short circuit is caused between the output terminals $D_O$ of the multiple output stage circuits 10*a*, since the gate of the IGBT 11 is put into a high impedance state at the time of outputting the VDH signal. As a result, the output terminal $D_O$ is put into a high impedance state, an overcurrent is prevented from flowing, and thus the IGBTs 11 and 12 are prevented from being broken down.

Now the display driver according to the second embodiment will be described in more detail. FIG. 16 is a block diagram of the display driver according to the second embodiment of the invention. Referring now to FIG. 16, the display driver 100*c* according to the second embodiment includes output stage circuits 10*a*-1, 10*a*-2, 10*a*-3, . . . , and 10*a*-n for a plurality of bits (e.g. 64 bits). Corresponding to the output stage circuits 10*a*-1 through 10*a*-n, the display driver 100*c* includes shift registers 30-1, 30-2, 30-3, . . . , and 30-n. These shift registers convert the serial signals, controlling the scanning and holding electrodes 911 shown in FIG. 25 and inputted via a terminal DATA, to parallel signals in synchronism with the clock signal inputted to a terminal CLK. The display driver 100*c* further includes data selectors 40-1, 40-2, 40-3, . . . , and 40-n, which send the signals transferred bit by bit from the shift registers 30-1, 30-2, 30-3, . . . , and 30-n to the output stage circuits 10*a*-1, 10*a*-2, 10*a*-3, . . . , and 10*a*-n. A terminal SH and a terminal SL are connected to the data selectors 40-1, 40-2, 40-3, . . . , and 40-n. An all-the-outputs H-level-fixing signal for fixing all the scanning and holding electrodes 911 at the H level is inputted to the terminal SH. An all-the-outputs L-level-fixing signal for fixing all the scanning and holding electrodes 911 at the L level is inputted to the terminal SL. One control signal output circuit 70 is disposed commonly for all the output stage circuits 10*a*-1 through 10*a*-n for all the bits.

Figure 17:
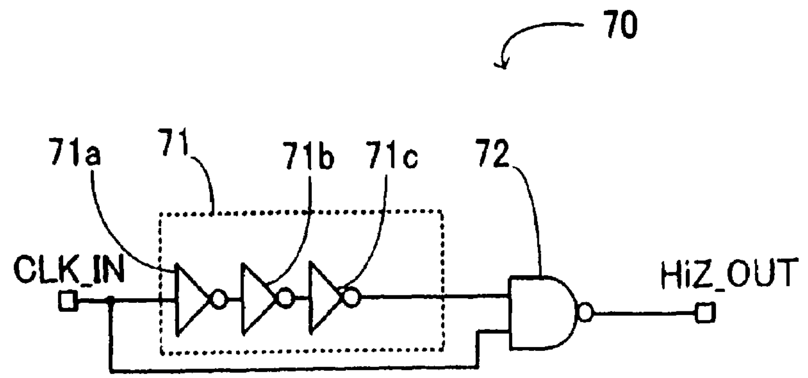
FIG. 17 is a block circuit diagram of the control signal output circuit.

The output stage circuits 10*a*-1 through 10*a*-n have the same structure as the output stage circuit 10*a* shown in FIG. 14. FIG. 17 is a block circuit diagram of the control signal output circuit.

The control signal output circuit 70 includes a delay circuit 71 and a NAND circuit 72. The delay circuit 71 includes an odd number of inverters connected in series, e.g. inverters 71*a*, 71*b*, and 71*c*. Although three inverters 71*a*, 71*b*, and 71*c* connected in series are shown by way of example in FIG. 17, the number of the inverters may be selected appropriately to adjust the delay time tda as described above with reference to FIG. 15. The delay time tda in the delay circuit 71 is set, e.g. around 200 ns, within which the output signal is set at the H level or the L level.

The NAND circuit 72 performs a logic NAND operation on the clock signal inputted from the clock signal input terminal CLK_IN and the signal obtained by delaying the clock signal in the delay circuit 71, and outputs the result of the logic NAND operation from the control signal output terminal HiZ_OUT as a control signal.

Figure 18:
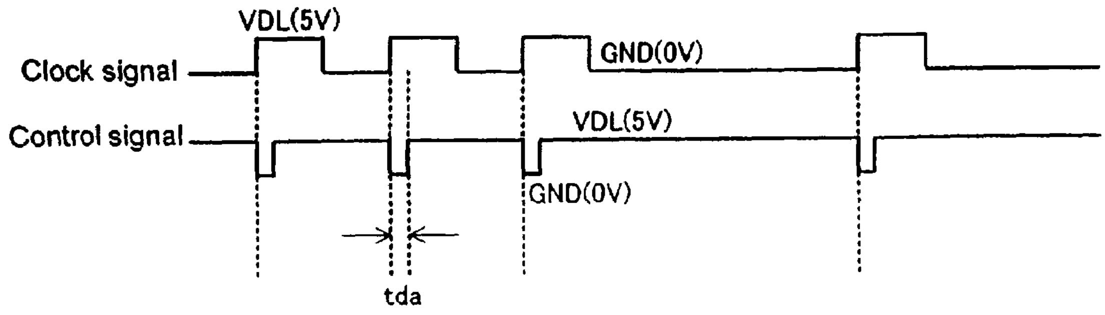
FIG. 18 is a timing chart illustrating the operations of the control signal output circuit.

Now the operations of the control signal output circuit 70 will be described. FIG. 18 is a timing chart illustrating the operations of the control signal output circuit. FIG. 18 shows the voltage waveforms of the clock signal inputted to the clock signal input terminal CLK_IN, and of the control signal output from the control signal output circuit 70 and taken out from the control signal output terminal HiZ_OUT.

As the clock signal is inputted, the control signal is set during the rising front of the clock signal at the L level (GND (0 V) in FIG. 18) for the delay time tda of the delay circuit 71. After the delay time tda has elapsed, the control signal returns to the H level.

The other structure is the same as that of the display driver 100*a* according to the first embodiment. The output waveforms from the display driver 100*c* as described above are the same as those illustrated in FIG. 6 when the display driver 100*c* is operating normally with the output terminals $D_O$1 through $D_O$n thereof not short-circuited with each other.

Figure 19:
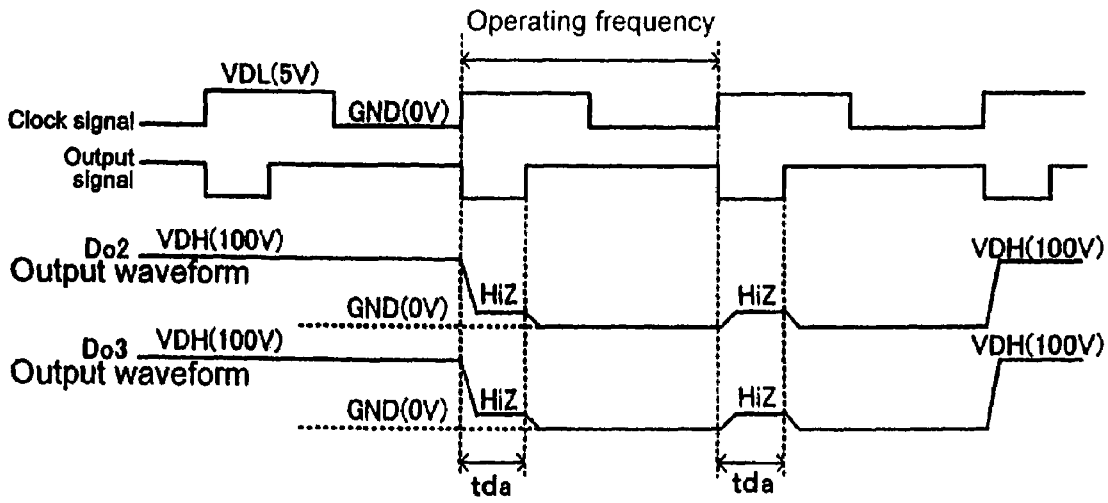
FIG. 19 is a wave chart illustrating the output waveforms from the short-circuited output terminals $D_O$2 and $D_O$3 in the display driver according to the second embodiment.

When the output terminals $D_O$2 and $D_O$3 are short-circuited to each other, the display driver 100*c* according to the second embodiment works in the following manner. FIG. 19 is a wave chart illustrating the output waveforms from the short-circuited output terminals $D_O$2 and $D_O$3 in the display driver 100*c* according to the second embodiment.

In the display driver 100*c* according to the second embodiment, a control signal at the H level is inputted to all the output stage circuits 10*a*-1 through 10*a*-n when the delay time tda set in the control signal output circuit 70 (cf. FIG. 17) has elapsed after the input of the last clock signal. As a result, the NMOSs 13*d* in the level shifter circuits 13 of all the output stage circuits 10*a*-1 through 10*a*-n are turned off, putting the gate of the IGBTs 11 into a high impedance state. Since the gate potential of the IGBT 11 is affected by the potential of the output terminal $D_O$ when a short circuit occurs, the gate potential of the IGBT 11 is made to fall and, therefore, the IGBT 11 is turned off.

Since the IGBT 11 connected to the high voltage supply terminal VDH usually exhibits a driving capability three times as high as the driving capability of the IGBT 12 connected to the reference voltage supply terminal GND, the output level becomes closer to 0 V when a short circuit occurs between the output terminals of the conventional display driver. Since a current as high as the driving capability of the IGBT 11 keeps flowing through the IGBT 11 in this circumstance, the heat caused by the high current breaks down the IGBT 11. As the IGBT 11 breaks down, the IGBT 12 also is broken down.

In the display driver 100*c* according to the second embodiment, since the NMOS 13*d* in the level shifter circuit 13 is turned off 200 ns later than the turn-on of the IGBT 11, the output of the level shifter circuit 13 is set at an HiZ level. Since the gate potential of the IGBT 11 is affected by the potential of the output terminal $D_O$ when a short circuit thereof occurs, the gate potential of the IGBT 11 in such an event is made to fall and, therefore, the IGBT 11 is turned off. As the IGBT 11 is turned off, the output waveforms from the output terminals $D_O$2 and $D_O$3 are set at an HiZ level (the output terminals $D_O$2 and $D_O$3 are put into a high impedance state) as shown in FIG. 19, and the IGBTs 11, 12 are prevented from breaking down even when the output terminals are short-circuited.

If the IGBT 11 is tough enough not to be broken down for the delay time tda of around 200 ns even when a short circuit occurs, the IGBT 11 will not be broken down by the short circuit even when the operating frequency is low. As described above, the display driver 100*c* according to the second embodiment facilitates preventing the IGBTs from being broken down without reducing the current densities of the IGBTs when the output terminals $D_O$1 through $D_O$n are short-circuited. Therefore, the display driver for driving the PDPs can be designed without widening the area thereof.

Now a display device driver circuit according to a third embodiment of the invention will be described. The display device driver circuit according to the third embodiment includes output stage circuits that put the respective output terminals $D_O$ thereof into a high impedance state without using any control signal.

Figure 20:
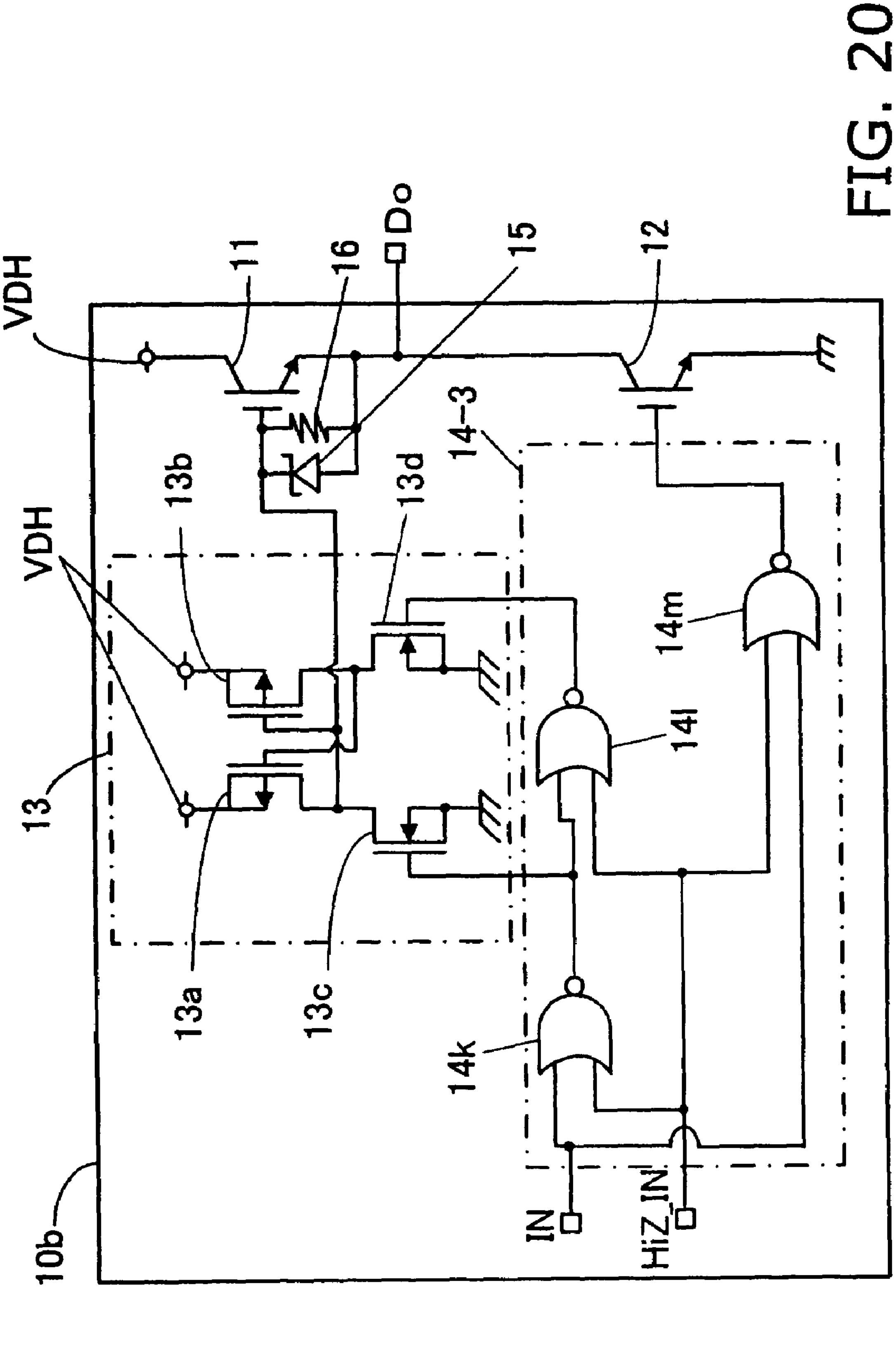
FIG. 20 is a block circuit diagram of an output stage circuit according to a third embodiment of the invention.

FIG. 20 is a block circuit diagram of the output stage circuit according to the third embodiment of the invention. The output stage circuit 10*b* according to the third embodiment includes IGBTs 11 and 12, a level shifter circuit 13, and a logic circuit section 14-3.

Since the circuit configuration of the level shifter circuit 13 is the same as that of the level shifter circuit according to the first embodiment, the same reference numerals as used to designate constituent elements in the level shifter circuit according to the first embodiment are used to designate the circuit constituent elements in the level shifter circuit shown in FIG. 20, and what would be duplicative descriptions of these elements are omitted. The logic circuit section 14-3 includes three NOR circuits 14*k*, 14*l*, and 14*m*, which differs from the logic circuit sections 14-1 and 14-2 according to the first and second embodiments.

One of the two input terminals of the NOR circuit 14*k* is connected to an input terminal IN, and the other input terminal of the NOR circuit 14*k* is connected to a control signal input terminal HiZ_IN. The output terminal of the NOR circuit 14*k* is connected to the gate terminal of the NMOS 13*c* in the level shifter circuit 13 and one of the two input terminals of the NOR circuit 14*l*.

The other input terminal of the NOR circuit 14*l* is connected to the control signal input terminal HiZ_IN and the output terminal of the NOR circuit 14*l* is connected to the gate terminal of the NMOS 13*d* in the level shifter circuit 13. One of the input terminals of the NOR circuit 14*m* is connected to the input terminal IN and the other input terminal of the NOR circuit 14*m* is connected to the control signal input terminal HiZ_IN. The output terminal of the NOR circuit 14*m* is connected to the gate terminal of the IGBT 12.

Since the other configurations are the same as those in the output stage circuit 10*a* according to the second embodiment illustrated in FIG. 14, their descriptions are omitted. Now the operations of the output stage circuit shown in FIG. 20 according to the third embodiment will be described.

Figure 21:
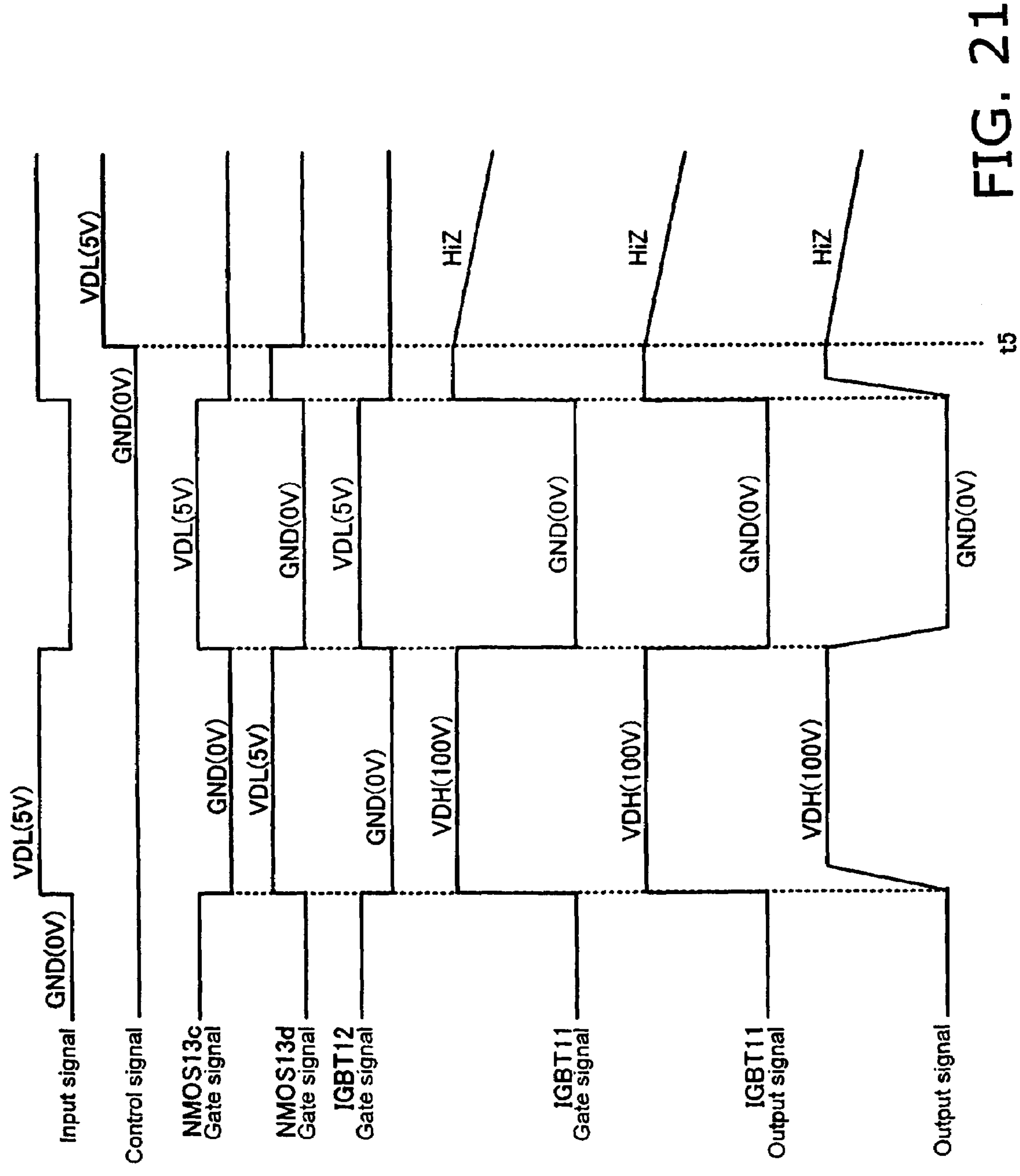
FIG. 21 is a timing chart illustrating the operations of the output stage circuit according to the third embodiment.

FIG. 21 is a timing chart illustrating the operations of the output stage circuit according to the third embodiment of the invention. In the normal operation (in which the control signal is at the L level), the output signal from the output terminal Do changes in response to the input signal from the input terminal IN. In FIG. 21, as the input signal is set at the H level, the output from the NOR circuit 14*k* is set at the L level. Since the L-level output from the NOR circuit 14*k* works as the gate signal of the NMOS 13*c* in the level shifter circuit 13, the NMOS 13*c* is turned off. On the other hand, the output from the NOR circuit 14*l* is set at the H level. Since the H-level output from the NOR circuit 14*l* works as the gate signal of the NMOS 13*d* in the level shifter circuit 13, the NMOS 13*c* is turned on. As a result, the PMOS 13*a* is turned on, the PMOS 13*b* is turned off, the gate signal of the IGBT 11 is set at the VDH level, turning on the IGBT 11, and the output from the turned-on IGBT 11 rises to the VDH level. On the other hand, the output from the NOR circuit 14*m* is set at the L level. Since the L-level output from the NOR circuit 14*m* works as the gate signal of the IGBT 12, the IGBT 12 is turned off. As a result of the operations described above, the output signal from the output terminal Do rises to the VDH level.

As the input signal is set at the L level, the output from the NOR circuit 14*k* is set at the H level. Since the H-level output from the NOR circuit 14$k$ works as the gate signal of the NMOS 13$c$ in the level shifter circuit 13, the NMOS 13$c$ is turned on. On the other hand, the output from the NOR circuit 14$l$ is set at the L level. Since the L-level output from the NOR circuit 14$l$ works as the gate signal of the NMOS 13$d$ in the level shifter circuit 13, the NMOS 13$d$ is turned off. As a result, the PMOS 13$a$ is turned off, the PMOS 13$b$ is turned on, the gate signal of the IGBT 11 is set at the L level (GND), turning off the IGBT 11, and the output from the turned-off IGBT 11 falls. On the other hand, the output from the NOR circuit 14$m$ is set at the H level. Since the H-level output from the NOR circuit 14$m$ works as the gate signal of the IGBT 12, the IGBT 12 is turned on. As a result of the operations described above, the output signal from the output terminal Do falls to GND.

As an H-level control signal is inputted from the control signal input terminal HiZ_IN at the time t5, all the outputs from the NOR circuits 14$k$, 14$l$, and 14$m$ are set at the L level. As a result, the gate signals of the NMOSs 13$c$ and 13$d$ in the level shifter circuit 13 are set at the L level and, therefore, the NMOSs 13$c$ and 13$d$ are turned off. Since the gate signal of the IGBT 12 is set also at the L level, the IGBT 12 is turned off. The gate signal of the IGBT 11 is set at an HiZ level. The output signal from the IGBT 11 is set at an HiZ level and the output terminal $D_O$ is put into a high impedance state.

As illustrated in FIG. 11, the operations of the display driver of the PDP may be divided into an address discharge period and a discharge holding period. When the output terminals $D_O$ are short-circuited in the address discharge period, the IGBTs may be break down since the potentials of the adjacent bits are different from each other in some causes. The short circuit between the output terminals $D_O$ is prevented from occurring, in the same way as described above with respect to the second embodiment, by setting the control signal at the H level after the elapse of a period of time, e.g. 200 ns, within which the clock signal rises and the output signals from the output terminals $D_O$ are fixed at the H level or the L level, so that the output terminals $D_O$ may be put into a high impedance state. To facilitate this in the display driver according to the third embodiment, the control signal is inputted to the output stage circuit 10$b$ employing the control signal output circuit 70 used in the display driver 100$c$ according to the second embodiment. In this case, the display driver according to the third embodiment has circuit configurations that are same as those of the display driver 100$c$ according to the second embodiment shown in FIG. 16, except for the output stage circuit 10$b$.

Figure 22:
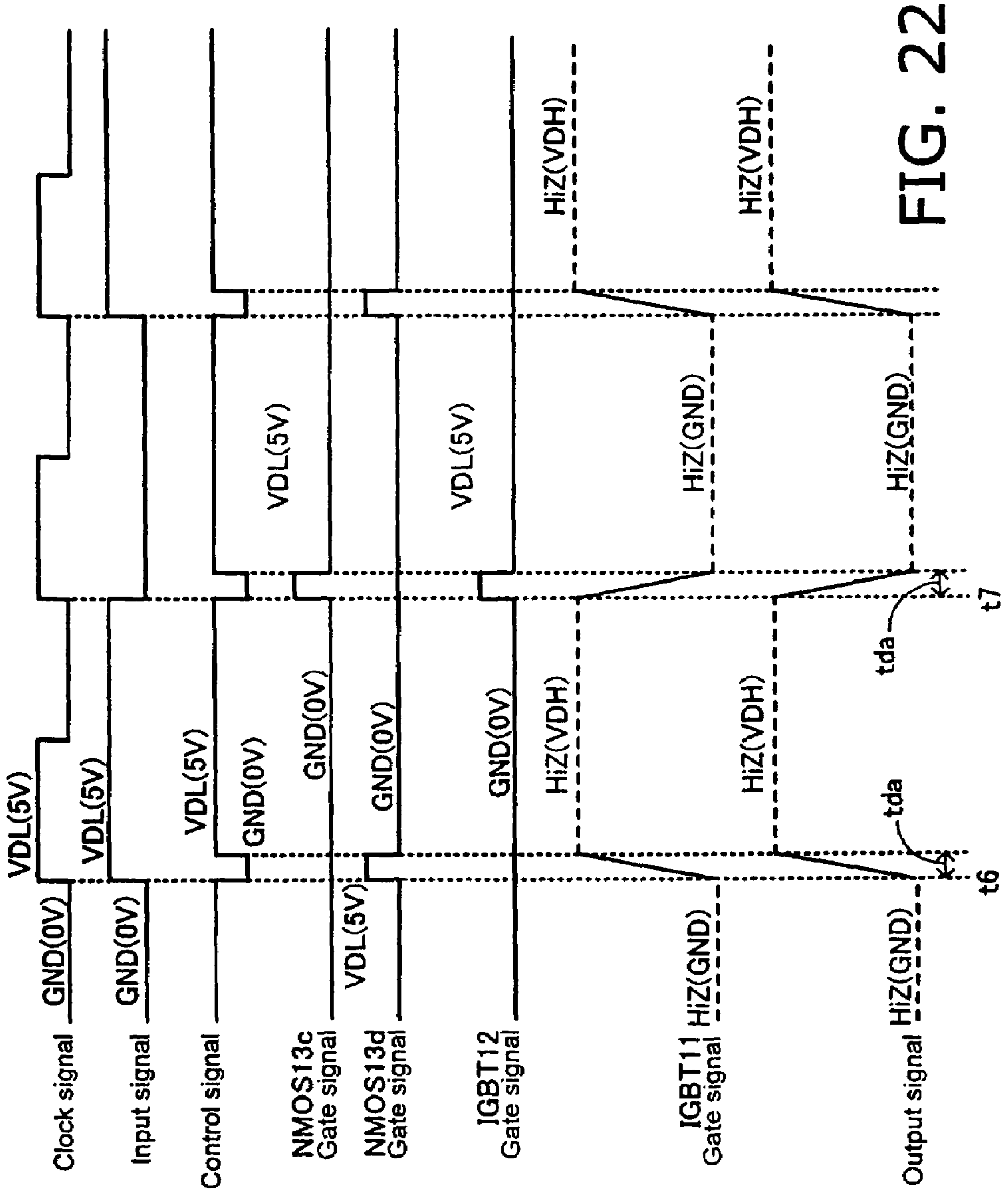
FIG. 22 is a timing chart illustrating the modified operations of the output stage circuit according to the third embodiment.

The operations of the display driver according to the third embodiment that employs the control signal inputted from the control signal output circuit 70 as shown in FIG. 17, will be described below. FIG. 22 is a timing chart illustrating the modified operations of the output stage circuit according to the third embodiment of the invention.

As the input signal is set at the H level in synchronism with the clock signal (at the time t6 in FIG. 22), the control signal is set at the L level. At this time, the output from the NOR circuit 14$k$ is set at the L level and the gate signal of the NMOS 13$c$ is set at the L level, turning off the NMOS 13$c$. Since the output from the NOR circuit 14$l$ is set at the H level and the H-level output from the NOR circuit 14$l$ works as the gate signal of the NMOS 13$d$, the NMOS 13$d$ is turned on. And, the PMOS 13$a$ is turned on and the PMOS 13$b$ is turned off. As a result, the output from the level shifter circuit 13 rises to the VDH level (100 V). Since the output from the level shifter circuit 13 set at the VDH level works as the gate signal of the IGBT 11, the IGBT 11 is turned on.

On the other hand, when the input signal is at the H level, the output from the NOR circuit 14$m$ is at the L level. Since the L-level output from the NOR circuit 14$m$ is working as the gate signal of the IGBT 12, the IGBT 12 is OFF. As a result of these operations, the output signal from the output terminal $D_O$ rises to the VDH level (100 V). When the output signal rises, the control signal output circuit 70 sets the control signal at the H level after the elapse of a period of time, e.g. 200 ns, within which the gate signal of the IGBT 11 reaches the VDH level. As a result, the output from the NOR circuit 14$l$ is set at the L level and the gate signal of the NMOS 13$d$ is set at the L level, turning off the NMOS 13$d$. Since the NMOS 13$c$ is OFF at this time, the gate the IGBT 11 is put into a high impedance state (the gate signal at an HiZ level (the VDH level)). In the high impedance state, each constituent circuit device in the level shifter circuit 13 keeps the level thereof by the capacitance thereof and keeps the output IGBT 11 ON.

As the input signal from the input terminal IN is set at the L level (at the time t7) in synchronism with the clock signal, the control signal is set also at the L level. Since the output from the NOR circuit 14$k$ is set at the H level, the gate signal of the NMOS 13$c$ in the level shifter circuit 13 is set at the H level and the NMOS 13$c$ is turned on. On the other hand, since the output from the NOR circuit 14$l$ is set at the L level, the gate signal of the NMOS 13$d$ stays at the L level and the NMOS 13$d$ remains OFF. And, the PMOS 13$a$ is turned off and the PMOS 13$b$ is turned on. Since the level shifter circuit 13 outputs a signal at the L level and since the L-level signal from the level shifter circuit 13 works as the gate signal of the IGBT 11, the IGBT 11 is turned off. When the input signal is at the L level, the output from the NOR circuit 14$m$ is set at the H level. The H-level output from the NOR circuit 14$m$ works as the gate signal of the IGBT 12, the IGBT 12 is turned on, and the output signal from the output terminal $D_O$ falls to 0 V. As the control signal is set at the H level after the delay time td has elapsed, the output from the NOR circuit 14$k$ is set at the L level. Since the L-level output from the NOR circuit 14$k$ works as the gate signal of the NMOS 13$c$, the NMOS 13$c$ is turned off. Since the output from the NOR circuit 14$l$, which is the gate signal of the NMOS 13$d$, stays at the L level, the NMOS 13$d$ is OFF. As a result, the gate of the IGBT 11 is put into the high impedance state (the gate potential is set at the HiZ level (GND)). Since the output from the NOR circuit 14$m$ is set at the L level, which is the gate potential of the IGBT 12, the IGBT 12 is turned off. By the operations described above, the IGBTs 11 and 12 are turned off and the output terminal $D_O$ is put into a high impedance state.

Since the output terminal $D_O$ is put into the high impedance state by setting the control signal at the H level after the elapse of the period (around 200 ns in the above descriptions) within which the output signal is fixed at the H level or the L level in synchronism with the clock signal, breakdown of the IGBTs 11 and 12 caused by an overcurrent due to a short circuit between the terminals (cf. FIG. 19), is prevented from occurring.

Schemes have been described for preventing breakdown of the IGBTs due to a short circuit during the address discharge period. However, breakdown of the IGBTs due to a short circuit between the terminals during the discharge holding period illustrated in FIG. 11, also may be prevented from occurring, by putting the output terminals $D_O$ into the high impedance state by setting the control signal at the H level appropriately.

Since the IGBT 12 is also turned off by the control signal in the same manner as according to the first embodiment, the IGBTs 11 and 12 are prevented from being broken down by a short circuit of the output terminal $D_O$ and the power supply VDH.

As described above, the display device driver circuit according to the third embodiment facilitates preventing the IGBTs from being broken down, without reducing the current density of the IGBTs even when the output terminals $D_O$1 through $D_O$n are short-circuited. Therefore, the display device driver circuit for driving the PDPs is designed without widening the area thereof.

Now a display device driver circuit according to a fourth embodiment of the invention will be described. The display driver according to the fourth embodiment includes an output stage circuit that turns off the IGBTs 11 and 12 by the control signal and puts the output terminal $D_O$ into a high impedance state.

Figure 23:
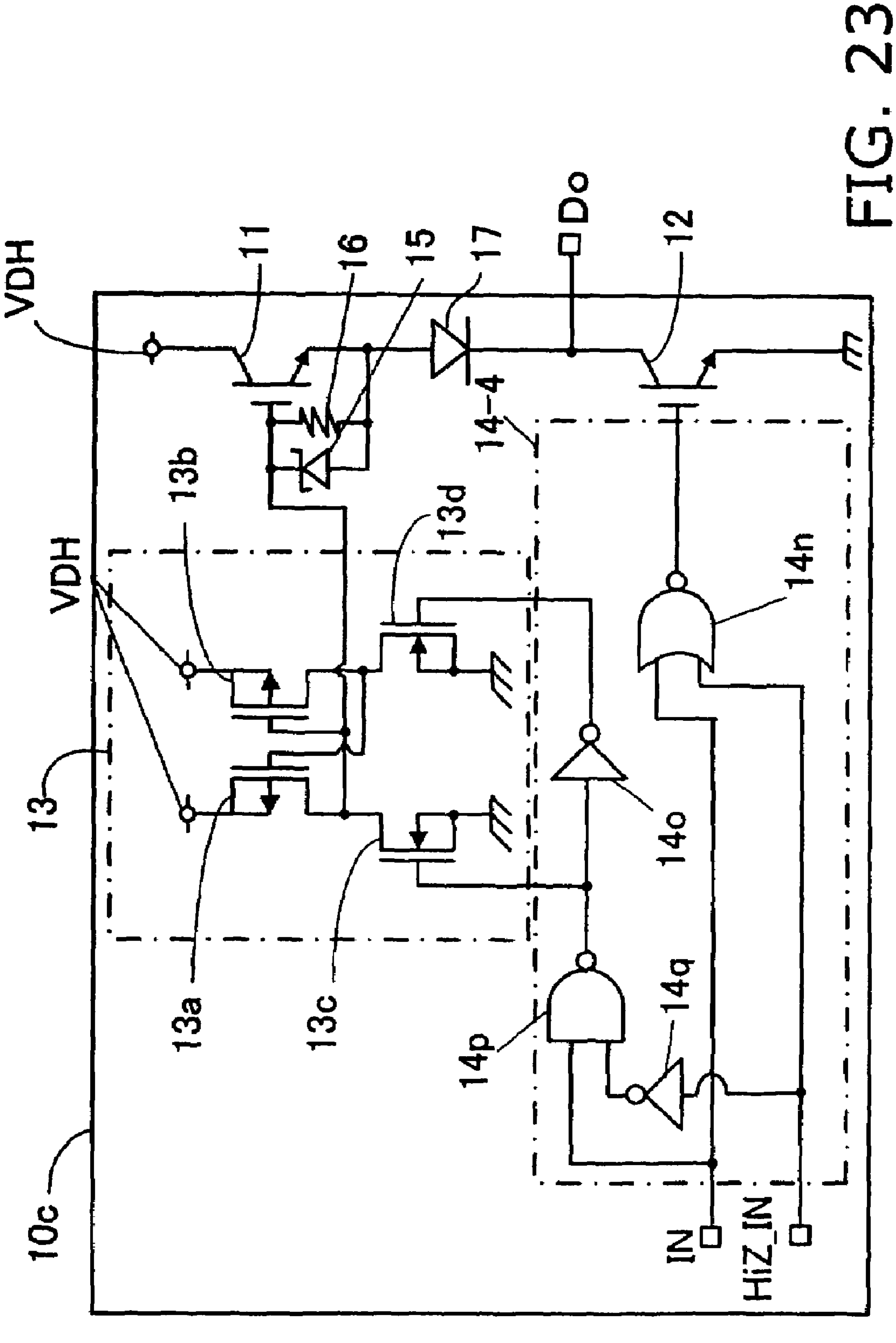
FIG. 23 is a block circuit diagram of an output stage circuit in a display device driver circuit according to a fourth embodiment of the invention.

FIG. 23 is the block circuit diagram of an output stage circuit according to the fourth embodiment. Referring to FIG. 23, the output stage circuit 10*c* includes IGBTs 11 and 12, a level shifter circuit 13, a logic circuit section 14-4, and a diode 17.

Since the circuit configuration of the level shifter circuit 13 is the same as that of the level shifter circuit according to the first embodiment, the same reference numerals as used in FIG. 1 are used to designate the same constituent circuit elements, and what would be duplicative descriptions of these elements are omitted. The logic circuit section 14-4 is different from the logic circuit sections 14-1 through 14-3 according to the first through third embodiments. In detail, the logic circuit section 14-4 includes two NOT circuits 14*o* and 14*q*, a NOR circuit 14*n*, and a NAND circuit 14*p*.

The input terminal of the NOT circuit 14*q* is connected to the control signal input terminal HiZ_IN and the output terminal of the NOT circuit 14*q* is connected to one of the input terminals of the NAND circuit 14*p*. The other input terminal of the NAND circuit 14*p* is connected to the input terminal IN and the output terminal of the NAND circuit 14*p* is connected to the gate terminal of the NMOS 13*c* in the level shifter circuit 13 and the input terminal of the NOT circuit 14*o*.

The output terminal of the NOT circuit 14*o* is connected to the gate terminal of the NMOS 13*d* in the level shifter circuit 13. One of the input terminal of the NOR circuit 14*n* is connected to the input terminal IN and the other input terminal of the NOR circuit 14*n* is connected to the control signal input terminal HiZ_IN. The output terminal of the NOR circuit 14*n* is connected to the gate terminal of the IGBT 12.

The diode 17 is connected between the emitter of the IGBT 11 and the output terminal $D_O$. Since the other configurations of the output stage circuit 10*c* are the same with those of the output stage circuit 10*a* in the display driver according to the second embodiment, what would be duplicative descriptions of these configurations are omitted.

Figure 24:
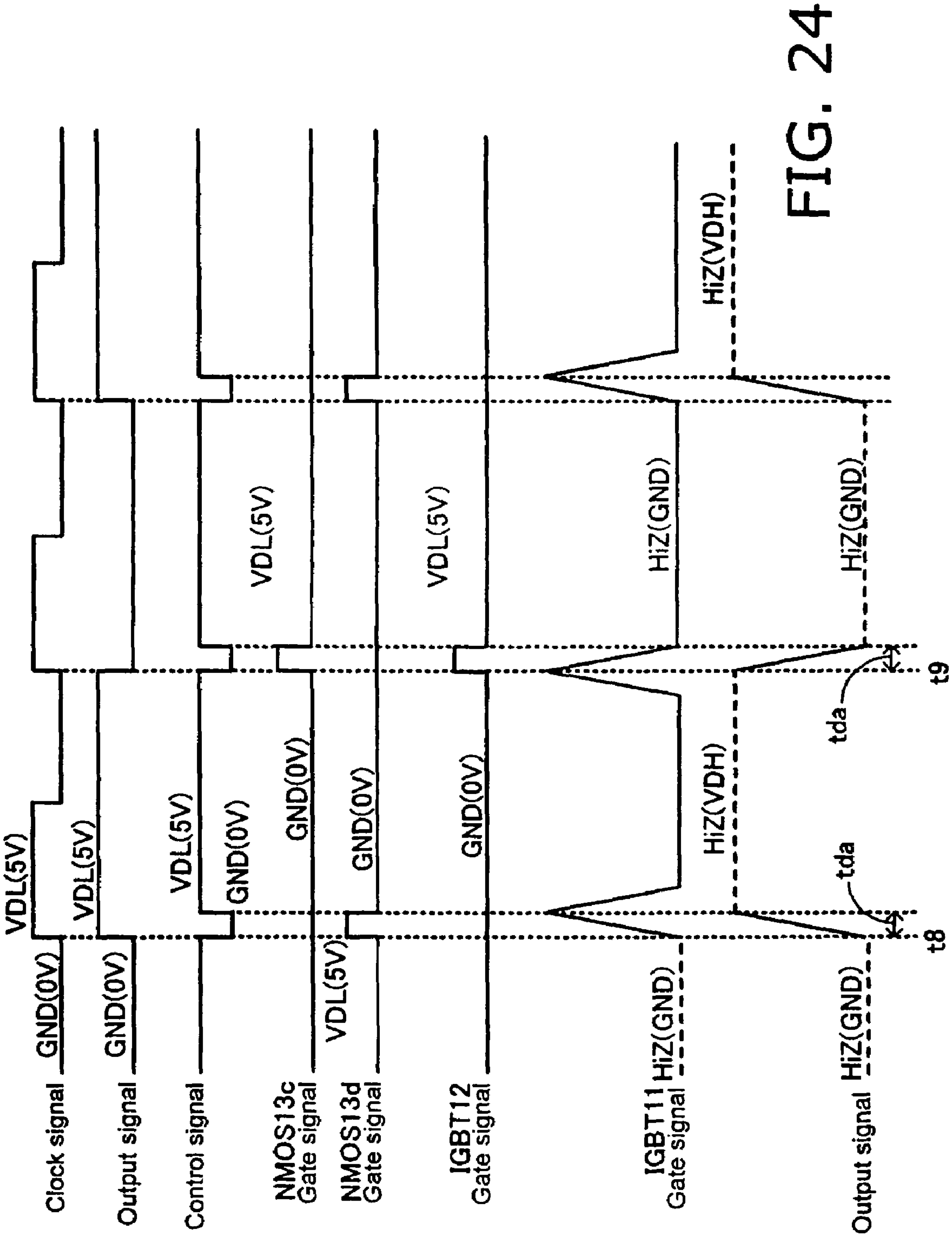
FIG. 24 is a timing chart illustrating the operations of the output stage circuit according to the fourth embodiment.

Now the operations of the output stage circuit according to the fourth embodiment will be described in connection with the use of the control signal inputted from the control signal output circuit 70 shown in FIG. 17. FIG. 24 is a timing chart illustrating the operations of the output stage circuit according to the fourth embodiment.

As the input signal is set at the H level in synchronism the clock signal (at the time t8), the control signal is set at the L level. At this time, the output from the NAND circuit 14*p* is set at the L level and the gate signal of the NMOS 13*c* in the level shifter circuit 13 is set at the L level, turning off the NMOS 13*c*. The output from the NOT circuit 14*o* is set at the H level. Since the H-level output from the NOT circuit 14*o* works as the gate signal of the NMOS 13*d*, the NMOS 13*d* is turned on. And, the PMOS 13*a* is turned on and the PMOS 13*b* is turned off. As a result, the output from the level shifter circuit 13 rises to the VDH level (100 V). Since the output from the level shifter circuit 13 set at the VDH level works as the gate signal of the IGBT 11, the IGBT 11 is turned on. On the other hand, the output from the NOR circuit 14*n* is at the L level when the input signal is at the H level. Since the L-level output from the NOR circuit 14*n* is working as the gate signal of the IGBT 12, the IGBT 12 is OFF. As a result of the operations described above, the output signal rises to the VDH level. While the output signal is rising to the VDH level, the control signal output circuit 70 sets the control signal therefrom at the H level after the elapse of a period of time, e.g. 200 ns, within which the gate signal of the IGBT 11 reaches the VDH level. As a result, the output from the NOR circuit 14*o* is set at the L level and the gate signal of the NMOS 13*d* in the level shifter circuit 13 is set at the L level, turning off the NMOS 13*d*. Since the output from the NAND circuit 14*p* is set at the H level and the NMOS 13*c* is turned on at this time, the gate signal of the IGBT 11 is set at the L level. Therefore, the IGBT 11 is turned off.

Next, as the input signal from the input terminal IN is set at the L level in synchronism the clock signal (at the time t9), the control signal is set at the L level. At this time, the output from the NAND circuit 14*p* is set at the H level and the gate signal of the NMOS 13*c* in the level shifter circuit 13 is set at the H level, turning on the NMOS 13*c*. Since the output from the NOT circuit 14*o* is set at the L level, the gate signal of the NMOS 13*d* stays at the L level and the NMOS 13*d* remains OFF. And, the PMOS 13*a* is turned off and the PMOS 13*b* is turned on. As a result, the level shifter circuit 13 outputs a signal at the L level. Since the L-level output signal from the level shifter circuit 13 works as the gate signal of the IGBT 11, the IGBT 11 is turned off. When the input signal is at the L level, the output from the NOR circuit 14*n* is set at the H level. Since the H-level output from the NOR circuit 14*n* works as the gate signal of the IGBT 12, the IGBT 12 is turned on and the output signal from the output terminal $D_O$ falls to 0 V. As the control signal is set at the H level after the delay time tda has elapsed, the output from the NAND circuit 14*p* stays at the H level and the NMOS 13*c* is ON. Since the output from the NOT circuit 14*o* (the gate signal of the NMOS 13*d*) stays at the L level, the NMOS 13*d* is OFF. As a result, the gate signal of the IGBT 11 is set at the L level. Since the output from the NOR circuit 14*n* is set at the L level and since the L-level output from the NOR circuit 14*n* is the gate potential of the IGBT 12, the IGBT 12 is turned off. As a result of the operations described above, the IGBTs 11 and 12 are turned off and the output terminal $D_O$ is put into a high impedance state. When the diode 17 is not provided, the potential of the output terminal $D_O$ is affected by the gate potential of the IGBT 11 and set at the L level. By connecting the diode 17 between the IGBTs 11 and 12, the output terminal $D_O$ is put into the high impedance state.

As noted above, the output terminal $D_O$ is put into the high impedance state by setting the control signal at the H level after the elapse of a period of time (around 200 ns in the above descriptions) within which the output signal is fixed at the H level or the L level in synchronism with the clock signal. Therefore, a breakdown of the IGBTs 11 and 12 from an overcurrent due to a short circuit between the terminals (cf. FIG. 19) is prevented from occurring.

Although the fourth embodiment of the invention has been described in connection with the short circuit prevention during the address discharge period, a short circuit between the terminals is prevented from occurring also in the discharge holding period by putting the output terminals $D_O$ into a high impedance state by setting the control signal at the H level appropriately as illustrated in FIG. 11.

As described above, the IGBTs 11 and 12 are prevented from being broken down, without reducing the current densities of the IGBTs, also by the display driver according to the fourth embodiment, even when the output terminals $D_O$1 through $D_O$n are short circuited. However, if the diode 17 is formed so that the current capacity of the IGBT 11 may not be limited, the device size of the diode 17 will be larger and, therefore, the area of the output stage circuit will be wider. Due to the narrow device areas of the IGBTs 11 and 12, the area of the output stage circuit including the diode 17 is still narrower than the area of the output stage circuit according to the first embodiment, in which the device areas of the IGBTs 11 and 12 are widened in exchange for lowering the current densities thereof so that the IGBTs 11 and 12 will not be break down even if short circuit continues for a long time. However, the area of the output stage circuit including the diode 17 is wider than the area of the output stage circuit according to the second embodiment or the third embodiment by an amount corresponding to the area occupied by the diode 17.

Although the IGBTs 11 and 12 are employed for the switches in the output stage of the display drivers according to the first through fourth embodiments, alternatives exist. That is, devices having an insulated gate such as MOSFETs may be used for the switches in the output stage of the display driver.

Numerical values presented herein, such as the voltage values that are described above, are exemplary only and the invention is not so limited. Moreover, although the invention has been described in connection with the driver circuit for driving the PDP, the invention is applicable also to driver circuits of other flat panel display devices such as liquid crystal display panels and EL display devices.

In summary, the present invention is broadly applicable to drivers for driving flat panel display devices.

What is claimed is:

1. A display device driver circuit for driving a flat panel display, the display device driver circuit comprising:

- a plurality of output stage circuits, each output stage circuit including
  - an input terminal,
  - an output terminal,
  - a high voltage supply terminal supplying a high voltage,
  - a reference voltage supply terminal supplying a reference voltage,
  - a first transistor electrically connected between the output terminal and the high voltage supply terminal, and
  - a second transistor electrically connected between the output terminal and the reference voltage supply terminal,
  - each output stage circuit turning on the first transistor or the second transistor in response to an input signal inputted from the input terminal in synchronism with a clock signal, whereby to output an output signal from the output terminal thereof; and
- a timer circuit, the timer circuit outputting to the output stage circuits a control signal for turning off the first transistor and the second transistor when no clock signal is inputted thereto for a predetermined period of time upon detecting a last clock signal,
- the output stage circuits turning off the first transistor and the second transistor in response to the control signal from the timer circuit.

2. The display device driver circuit according to claim 1, wherein the output stage circuits each are provided for a plurality of bits, and the timer circuit is provided for all the bits.

3. The display device driver circuit according to claim 1, wherein the first transistor or the second transistor is turned on in response to the next clock signal detected by the timer circuit after outputting the control signal.

4. The display device driver circuit according to claim 1, wherein the flat panel display comprises a plasma display panel and the predetermined period of time is longer than an address discharge period of the plasma display panel but shorter than a short circuit withstand capability of the first transistor or the second transistor.

5. The display device driver circuit according to claim 1, wherein the timer circuit further detects an all-the-outputs H-level-fixing signal or an all-the-outputs L-level-fixing signal, and the timer circuit outputs the control signal when the clock signal, the all-the-outputs H-level-fixing signal or the all-the-outputs L-level-fixing signal is not provided for the predetermined period of time.

6. The display device driver circuit according to claim 5, wherein the flat panel display comprises a plasma display panel and the predetermined period of time is longer than the discharge holding period of the plasma display panel and shorter than the short circuit withstand capability of the first transistor or the second transistor.

7. The display device driver circuit according to claim 1, wherein the first transistor or the second transistor comprises an IGBT.

8. A display device driver circuit for driving a flat panel display, the display device driver circuit comprising:

- output stage circuits, each including
  - an input terminal,
  - an output terminal,
  - a high voltage supply terminal supplying a high voltage,
  - a reference voltage supply terminal supplying a reference voltage,
  - a first transistor electrically connected between the output terminal and the high voltage supply terminal, and
  - a second transistor electrically connected between the output terminal and the reference voltage supply terminal,
  - each output stage circuit turning on the first transistor or the second transistor in response to an input signal inputted from the input terminal in synchronism with a clock signal, whereby to output an output signal from the output terminal thereof; and
- a control signal output circuit, the control signal output circuit detecting clock signals input thereto and outputting to the output stage circuits a control signal for turning off the first transistor and the second transistor after a predetermined period of time has elapsed since last detecting a clock signal input thereto,
- the output stage circuits turning off the first transistor and the second transistor in response to the control signal inputted from the control signal output circuit.

9. The display device driver circuit according to claim 8, wherein the first transistor or the second transistor comprises an IGBT.

10. A display device driver circuit for driving a flat panel display, the display device driver circuit comprising:

output stage circuits, each including an input terminal an output terminal, a high voltage supply terminal supplying a high voltage, a reference voltage supply terminal supplying a reference voltage, a first transistor electrically connected between the output terminal and the high voltage supply terminal, and a second transistor electrically connected between the output terminal and the reference voltage supply terminal, each output stage circuit turning on or off the first transistor or the second transistor in response to an input signal inputted thereto from the input terminal in synchronism with a clock signal, whereby to output an output signal from the output terminal thereof; and a control signal output circuit, the control signal output circuit detecting clock signals input thereto and outputting to the output stage circuits a control signal for putting the gate of the first transistor into a high impedance state after a predetermined period of time has elapsed since last detecting a clock signal input thereto.

11. The display device driver circuit according to claim 10, wherein the output stage circuit further includes a level shifter circuit comprising third and fourth transistors for determining the gate potential of the first transistor, and one of the third and fourth transistors is controlled by the control signal.

12. The display device driver circuit according to claim 11, wherein the gate of the first transistor is put into a high impedance state by turning off the third and fourth transistors simultaneously by means of the input signal and the control signal.

13. The display device driver circuit according to claim 10, wherein the predetermined time is a period of time within which the gate potential is set at a high level and the output signal from the output terminal is fixed at the high level.

14. The display device driver circuit according to claim 10, wherein the output stage circuits are each provided for a plurality of bits, and the control signal output circuit is provided for all the bits.

15. The display device driver circuit according to claim 10, wherein the second transistor is turned off in response to the control signal.

16. The display device driver circuit according to claim 10, wherein the first transistor or the second transistor comprises an IGBT.

17. A display device driver circuit for driving a flat panel display, the display device driver circuit comprising:

a first transistor connected electrically between an output terminal and a high voltage supply terminal for supplying a high voltage;

a second transistor connected electrically between the output terminal and a reference voltage supply terminal for supplying a reference voltage; and a level shifter circuit comprising third and fourth transistors, the third and fourth transistors determining the gate potential of the first transistor in response to an input signal inputted thereto in synchronism with a clock signal, and the level shifter circuit turning off the third and fourth transistors simultaneously independently of the input signal when a control signal for putting the gate of the first transistor into a high impedance state is inputted thereto.

18. The display device driver circuit according to claim 17, wherein the second transistor is turned off as the control signal is inputted, whereby to put the output terminal into the high impedance state.

19. The display device driver circuit according to claim 17, wherein the control signal is inputted after elapse of a predetermined period of time within which the output signal from the output terminal is fixed at a high level or a low level.

20. The display device driver circuit according to claim 17, wherein the first transistor or the second transistor comprises an IGBT.

* * * * *